United States Patent
Patrick et al.

(10) Patent No.: US 9,964,680 B2
(45) Date of Patent: May 8, 2018

(54) PHOTOLUMINESCENT SEMICONDUCTOR NANOCRYSTAL-BASED LUMINESCENT SOLAR CONCENTRATORS

(71) Applicants: Western Washington University, Bellingham, WA (US); University of Washington through its Center for Commercialization, Seattle, WA (US)

(72) Inventors: David Patrick, Bellingham, WA (US); John Gilbertson, Bellingham, WA (US); Stephen McDowall, Bellingham, WA (US); Christian Erickson, Bellingham, WA (US); Daniel R. Gamelin, Seattle, WA (US); Liam Bradshaw, Seattle, WA (US); Emily Jane McLaurin, Seattle, WA (US); Kathryn E. Knowles, Seattle, WA (US)

(73) Assignees: Western Washington University, Bellingham, WA (US); University of Washington through its Center for Commercialization, Seattle, WA (US)

(*) Notice: Subject to any disclaimer, the term of this patent is extended or adjusted under 35 U.S.C. 154(b) by 0 days. days.

(21) Appl. No.: 14/902,113

(22) PCT Filed: Jul. 1, 2014

(86) PCT No.: PCT/US2014/045130
§ 371 (c)(1),
(2) Date: Dec. 30, 2015

(87) PCT Pub. No.: WO2015/002995
PCT Pub. Date: Jan. 8, 2015

(65) Prior Publication Data
US 2016/0327714 A1    Nov. 10, 2016

Related U.S. Application Data

(60) Provisional application No. 61/841,887, filed on Jul. 1, 2013, provisional application No. 61/895,224, filed on Oct. 24, 2013.

(51) Int. Cl.
*F21V 8/00*     (2006.01)
*H01L 31/055*   (2014.01)
(Continued)

(52) U.S. Cl.
CPC .......... *G02B 6/0003* (2013.01); *C09K 11/025* (2013.01); *C09K 11/565* (2013.01);
(Continued)

(58) Field of Classification Search
CPC .............. G02B 6/0003; G02B 19/0042; G02B 19/0019; H01L 31/02322; H01L 31/055;
(Continued)

(56) References Cited

U.S. PATENT DOCUMENTS 5,422,907 A * 6/1995 Bhargava .................. H01S 3/06
                                                    372/39
5,431,742 A    7/1995 Kleinerman
(Continued)

FOREIGN PATENT DOCUMENTS

WO    2015002995 A1    1/2015

OTHER PUBLICATIONS

Bomm, J., et al., "Fabrication and Full Characterization of State-of-the-Art Quantum Dot Luminescent Solar Concentrators," Solar Energy Materials & Solar Cells 95(8):2087-2094, Aug. 2011.
(Continued)

*Primary Examiner* — John M Bedtelyon
(74) *Attorney, Agent, or Firm* — Christensen O'Connor Johnson Kindness PLLC

(57) ABSTRACT

The present disclosure describes luminescent solar concentrators that include photoluminescent nanoparticles. The photoluminescent nanoparticles include a semiconductor nanocrystal that sensitizes the luminescence of a defect. The defect can include, for example, an atom, a cluster of atoms, or a lattice vacancy. The defect can be incorporated into the
(Continued)

semiconductor nanocrystal, adsorbed onto, or otherwise associated with the surface of the semiconductor nanocrystal.

44 Claims, 21 Drawing Sheets

(51) Int. Cl.
| | |
|---|---|
| H01L 31/0232 | (2014.01) |
| G02B 19/00 | (2006.01) |
| C09K 11/02 | (2006.01) |
| C09K 11/56 | (2006.01) |
| C09K 11/58 | (2006.01) |
| C09K 11/77 | (2006.01) |
| C09K 11/88 | (2006.01) |
| B82Y 20/00 | (2011.01) |
| B82Y 40/00 | (2011.01) |

(52) U.S. Cl.
CPC ........ *C09K 11/584* (2013.01); *C09K 11/7706* (2013.01); *C09K 11/7773* (2013.01); *C09K 11/883* (2013.01); *G02B 19/0019* (2013.01); *G02B 19/0042* (2013.01); *H01L 31/02322* (2013.01); *H01L 31/055* (2013.01); *B82Y 20/00* (2013.01); *B82Y 40/00* (2013.01); *Y02E 10/52* (2013.01); *Y10S 977/774* (2013.01); *Y10S 977/896* (2013.01); *Y10S 977/948* (2013.01); *Y10S 977/95* (2013.01)

(58) Field of Classification Search
CPC ... C09K 11/025; C09K 11/565; C09K 11/584; C09K 11/7706; C09K 11/7773; C09K 11/883; Y10S 977/896; Y10S 977/95; Y10S 977/948; Y10S 977/774; B82Y 40/00; B82Y 20/00
See application file for complete search history.

(56) References Cited

U.S. PATENT DOCUMENTS

| | | | | |
|---|---|---|---|---|
| 6,088,492 | A * | 7/2000 | Kaneko | C09D 183/14 |
| | | | | 385/14 |
| 6,723,396 | B1 | 4/2004 | Patrick | |
| 6,858,270 | B2 | 2/2005 | Patrick | |
| 7,374,807 | B2 | 5/2008 | Parce | |
| 7,776,630 | B1 | 8/2010 | Kar | |
| 8,012,377 | B2 | 9/2011 | Peng | |
| 2007/0053208 | A1 | 3/2007 | Justel et al. | |
| 2008/0070153 | A1 | 3/2008 | Ioku et al. | |
| 2009/0042314 | A1* | 2/2009 | Capobianco | B82Y 15/00 |
| | | | | 436/501 |
| 2010/0043878 | A1 | 2/2010 | Bhaumik et al. | |
| 2010/0055462 | A1 | 3/2010 | Cao | |
| 2010/0193011 | A1 | 8/2010 | Mapel et al. | |
| 2011/0195126 | A1* | 8/2011 | Weiss | B82Y 15/00 |
| | | | | 424/491 |
| 2011/0232752 | A1 | 9/2011 | Mataki | |
| 2011/0253198 | A1 | 10/2011 | Patrick et al. | |
| 2011/0284830 | A1* | 11/2011 | Zhou | C08G 61/02 |
| | | | | 257/40 |
| 2012/0031396 | A1 | 2/2012 | Schmaelzle et al. | |
| 2012/0104325 | A1 | 5/2012 | Talapin et al. | |
| 2012/0175588 | A1 | 7/2012 | Qiao et al. | |
| 2012/0222723 | A1 | 9/2012 | Mayer | |
| 2013/0026371 | A1 | 1/2013 | Holloway et al. | |
| 2013/0140506 | A1* | 6/2013 | Gamelin | C09K 11/883 |
| | | | | 252/519.4 |
| 2013/0146141 | A1* | 6/2013 | Pelton | G01T 1/20 |
| | | | | 136/259 |
| 2014/0130864 | A1 | 5/2014 | Lunt | |

OTHER PUBLICATIONS

Coropceanu, I., and Bawendi, M.G., "Core/Shell Quantum Dot Based Luminescent Solar Concentrators With Reduced Reabsorption and Enhanced Efficiency," NANO Letters 14(7):4097-4101, Jul. 2014.
Kozlowska, A., et al., "Spectroscopic Investigations of Rare-Earth Materials for Luminescent Solar Concentrators," Optica Applicata 41(2):359-365, 2011.
Krumer, Z., et al., "Tackling Self-Absorption in Luminescent Solar Concentrators With Type-II Colloidal Quantum Dots," Solar Energy Materials & Solar Cells 111:57-65, Apr. 2013.
Purcell-Milton, F., and Gun'ko, Y.K., "Quantum Dots for Luminescent Solar Concentrators," Journal of Materials Chemistry 22(33):16687-16697, Sep. 2012.
Wang, H., et al., "Transparent, Flexible and Luminescent Composite Films by Incorporating $CuInS_2$ Based Quantum Dots Into a Cyanoethyl Cellulose Matrix," RSC Advances 2(7):2675-2677, Apr. 2012.
Extended European Search Report dated Nov. 8, 2016, issued in corresponding European Application No. 14820247.6, filed Jul. 1, 2014, 6 pages.
Avnir et al., "Organic Fluorescent Dyes Trapped in Silica and Silica-Titania Thin Films by the Sol-Gel Method. Photophysical, Film and Cage Properties," Journal of Non-Crystalline Solids, 74(2-3):395-406, Nov. 1985.
Batchelder et al., "Luminescent solar concentrators. 1: Theory of operation and techniques for performance evaluation," Applied Optics, 18(18):3090-3110, Sep. 1979.
Batchelder et al., "Luminescent solar concentrators. 2: Experimental and theoretical analysis of their possible efficiencies," Applied Optics, 20(21):3733-3754, Nov. 1981.
Beaulac et al., "Light-Induced Spontaneous Magnetization in Doped Colloidal Quantum Dots," Science, 325 (5943):973-976, Aug. 2009.
Beaulac et al., "Spin-Polarizable Excitonic Luminescence in Colloidal Mn2+-Doped CdSe Quantum Dots," Nano Letters, 8(4):1197-1201, epub Mar. 2008.
Beaulac et al., "Luminescence in colloidal Mn2+-doped semiconductor nanocrystals," Journal of Solid State Chemistry, 181(7):1582-1589, Jul. 2008.
Bol and Meijerink, "Long-lived Mn2+ emission in nanocrystalline ZnS:Mn2+," Physical Review B, 58(24):R15997-R16000, Dec. 1998.
Bradshaw et al., "Luminescence Saturation via Mn2+-Exciton Cross Relaxation in Colloidal Doped Semiconductor Nanocrystals," Journal of Physical Chemistry C, 116(16):9300-9310, epub Mar. 2012.
Castro et al., "Energy collection efficiency of holographic planar solar concentrators," Applied Optics, 49(5):858-870, Feb. 2010.
Chen et al., "Compact high-quality CdSe—CdS core-shell nanocrystals with narrow emission linewidths and suppressed blinking," Nature Materials, 12(5):445-451, May 2013.
Chen et al., "Measurement of Energy Transfer Time in Colloidal Mn-Doped Semiconductor Nanocrystals," Journal of Physical Chemistry C, 114(10):4418-4423, epub Feb. 2010.
Chen et al., "Liquid Crystal Assisted Replica Molding Method to Align Uniaxial Molecules in Patterned Polymer at Ambient Temperature," Japanese Journal of Applied Physics, 47(11):8606-8610, Nov. 2008.
Corrado et al., "Cu-Doped ZnS Nanocrystals: Synthesis, Structure, and Optical Properties," Science of Advanced Materials, 4(2):254-265, Feb. 2012.
Currie et al., "High-efficiency organic solar concentrators for photovoltaics," Science, 321(5886):226-228, Jul. 2008.
De Boer et al., "Progress in phosphors and filters for luminescent solar concentrators," Optics Express, 20(S3):A395-A405, May 2012.
Debije and Verbunt, "Thirty Years of Luminescent Solar Concentrator Research: Solar Energy for the Built Environment," Advanced Energy Materials, 2(1):12-35, epub Dec. 2011.

(56) References Cited

OTHER PUBLICATIONS

Debije et al. "The Effect of an Organic Selectively-Reflecting Mirror on the Performance of a Luminescent Solar Concentrator," 24th European Photovoltaic Solar Energy Conference, Hamburg, Germany, pp. 373-376, Sep. 2009.
Debije et al., "Effect on the output of a luminescent solar concentrator on application of organic wavelength-selective mirrors," Applied Optics, 49(4):745-751, Feb. 2010.
Debije, "Solar Energy Collectors with Tunable Transmission," Advanced Functional Materials, 20(9):1498-1502, May 2010.
Erickson et al., "Zero-reabsorption doped-nanocrystal luminescent solar concentrators," ACS Nano, 8 (4):3461-3467, Apr. 2014.
Giebink et al., "Resonance-shifting to circumvent reabsorption loss in luminescent solar concentrators," Nature Photonics, 5:694-701, epub Sep. 2011.
Goetzberger and Greubel, "Solar energy conversion with fluorescent collectors," Applied Physics, 14 (2):123-139, Oct. 1977.
Goldschmidt et al., "Theoretical and experimental analysis of photonic structures for fluorescent concentrators with increased efficiencies," Physica Status Solidi (a), 205(12):2811-2821, Dec. 2008.
Green et al., "Solar cell efficiency tables (version 36)," Progress in Photovoltaics: Research and Applications, 18 (5):346-352, Aug. 2010.
Green et al., "Solar cell efficiency tables (version 37)," Progress in Photovoltaics: Research and Applications, 19(1):84-92, Jan. 2011.
Green et al., "Solar cell efficiency tables (version 39)," Progress in Photovoltaics: Research and Applications, 20(1):12-20, Jan. 2012.
Green et al., "Solar cell efficiency tables (version 40)," Progress in Photovoltaics: Research and Applications, 20(5):606-614, Aug. 2012.
Green et al., "Solar cell efficiency tables (version 41)," Progress in Photovoltaics: Research and Applications, 21(1):1-11, Jan. 2013.
Hoffman et al., "Giant internal magnetic fields in Mn doped nanocrystal quantum dots," Solid State Communications, 114(10):547-550, May 2000.
Huang et al., "Enhancing solar cell efficiency: the search for luminescent materials as spectral converters," Chemical Society Reviews, 42(1):173-201, Jan. 2013.
Hyldahl et al., "Photostability and performance of CdSe/ZnS quantum dots in luminescent solar concentrators," Solar Energy, 83(4):566-573, Apr. 2009.
International Search Report and Written Opinion dated Oct. 31, 2014 for PCT/US2014/045130 filed Jul. 1, 2014, 8 pages.
Irvine et al., "Direct Light-Driven Modulation of Luminescence from Mn-Doped ZnSe Quantum Dots," Angewandte Chemie International Edition, 47(14):2685-2688, Mar. 2008.
Kaino et al., "Low-loss plastic optical fibers," Applied Optics, 20(17):2886-2888, Sep. 1981.
Kovalenko et al., "Colloidal nanocrystals with molecular metal chalcogenide surface ligands," Science, 324(5933):1417-1420, Jun. 2009.
Kurtz, "Opportunities and Challenges for Development of a Mature Concentrating Photovoltaic Power Industry," National Renewable Energy Laboratory, Technical Report No. NREL/TP-520-43208, Jul. 2008, 20 pages.
Levin et al., "Efficiency of luminescent solar concentrators based on luminescent glasses," Journal of Applied Spectroscopy (translated from Zhurnal Prikladnoi Spektroskopii), 46(3):277-281 (or pp. 432-437 in Zhurnal rikladnoi Spektroskopii) , Mar. 1987.
Ma et al., "Polymer-based optical waveguides: materials, processing, and devices," Advanced Materials, 14(19):1339-1365, Oct. 2002.
Macqueen et al., "Towards an aligned luminophore solar concentrator," Optics Express, 18(Suppl 2):A161-A166, Jun. 2010.
Mcdowall et al.,"Simulations of luminescent solar concentrators: Effects of polarization and fluorophore alignment," Journal of Applied Physics, 108(5):053508, epub Sep. 2010.

Mcdowall et al., "Comprehensive analysis of escape-cone losses from luminescent waveguides," Applied Optics, 52(6):1230-1239, Feb. 2013.
Mclaurin et al.,"Water-soluble dual-emitting nanocrystals for ratiometric optical thermometry," Journal of the American Chemical Society, 133(38):14978-14980, epub Aug. 2011.
Mugnier et al., "A photometric approach of fluorescent solar concentrators. Role of diffuse reflectors and spectral sensitivity of solar cells," Revue de Physique Applique, 22(1): 89-99, Jan. 1987.
Mulder et al., "Dye alignment in luminescent solar concentrators: I. Vertical Alignment for improved waveguide coupling," Optics Express, 18(S1):A79-A90, Apr. 2010.
Mulder et al., "Dye alignment in luminescent solar concentrators: II. Horizontal alignment for energy harvesting in linear polarizers," 18(S1):A91-A99, Apr. 2010.
Nag et al., "Metal-free inorganic ligands for colloidal nanocrystals: S2-, HS-, Se2-, HSe-, Te2-, HTe-, TeS3(2-), OH-, and NH2- as surface ligands," Journal of the American Chemical Society, 133(27):10612-10620, Jul. 2011.
Norris et al., "High-Quality Manganese-Doped ZnSe Nanocrystals," Nano Letters, 1(1):3-7, epub Nov. 2000.
Olson et al., "Luminescent solar concentrators and the reabsorption problem," Applied Optics, 20(17):2934-2940, Sep. 1981.
Peters et al., "Spectrally-Selective Photonic Structures for PV Applications," Energies. 3(2):171-193, Jan. 2010.
Planelles-Aragó et al., "Synthesis, characterization and optical studies on lanthanide-doped CdS quantum dots: new insights on CdS → lanthanide energy transfer mechanisms," Journal of Materials Chemistry, 21:1162-1170, 2011; epub Nov. 2010.
Pradhan et al., "An Alternative of CdSe Nanocrystal Emitters: Pure and Tunable Impurity Emissions in ZnSe Nanocrystals," Journal of the American Chemical Society, 127(50):17586-17587, epub Nov. 2005.
Pradhan et al., "Efficient, Stable, Small, and Water-Soluble Doped ZnSe Nanocrystal Emitters as Non-Cadmium Biomedical Labels," Nano Letters, 7(2):312-317, epub Dec. 2006.
Rau et al., "Efficiency limits of photovoltaic fluorescent collectors," Applied Physics Letters, 87(17):171101, epub Oct. 2005.
Reiss et al., "Core/shell semiconductor nanocrystals," Small, 5(2):154-168, Jan. 2009.
Roncali and Garnier, "Photon-transport properties of luminescent solar concentrators: analysis and optimization," Applied Optics, 23(16):2809-2817, Aug. 1984.
Rosen et al.,"Exceptionally mild reactive stripping of native ligands from nanocrystal surfaces by using Meerwein's salt," Angewandte Chemie International Edition, 51(3):684-689, Jan. 2012.
Sanguineti et al., "High Stokes shift perylene dyes for luminescent solar concentrators," Chemical Communications, 49(16):1618-1620, Feb. 2013.
Sanguineti et al. "NIR emitting ytterbium chelates for colourless luminescent solar concentrators," Physical Chemistry Chemical Physics, 14(18):6452-6455, May 2012.
Saraidarov et al., "Non-self-absorbing materials for Luminescent Solar Concentrators (LSC)," Chemical Physics Letters, 492(1-3):60-62, May 2010.
Sarkar et al., "Ultrasmall Color Tunable Copper-Doped Ternary Semiconductor Nanocrystal Emitters," Angewandte Chemie International Edition, 50(27):6065-6069, Jun. 2011.
Shcerbatyuk et al.,"Viability of using near infrared PbS quantum dots as active materials in luminescent solar concentrators," Applied Physics Letters, 96:191901, epub May 2010, 4 pages.
Slooff et al., "The luminescent concentrator: a bright idea for spectrum conversion?" Paper No. ECN-RX—05-009, Presented at the 20th European Photovoltaic Solar Energy Conference and Exhibition, Barcelona, Spain, Jun. 2005, 4 pages.
Smestad et al., "The thermodynamic limits of light concentrators," Solar Energy Materials, 21(2-3):99-111, Dec. 1990.
Srivastava et al., "Doping Cu in Semiconductor Nanocrystals: Some Old and Some New Physical Insights," Journal of the American Chemical Society, 133(4):1007-1015, epub Dec. 2010.
Suyver et al., "Luminescence of nanocrystalline ZnSe:Mn2+," Physical Chemistry Chemical Physics, 2(23):5445-5448, epub Nov. 2000.

(56) References Cited

OTHER PUBLICATIONS

Swanson, "The Promise of Concentrators," Progress in Photovoltaics, 8(1):93-111, Jan./Feb. 2000.

Van Sark et al., "Luminescent Solar Concentrators—a review of recent results," Optics Express, 16(26):21773-21792, Dec. 2008.

Van Sark, "Luminescent Solar Concentrators—a low cost photovoltaics alternative," EPJ Web of Conferences, 2nd European Energy Conference, Maastricht, The Netherlands, vol. 33, Article No. 02003, Oct. 2012, 8 pages.

Verbunt and Debije, "Progress in Luminescent Solar Concentrator Research: Solar Energy for the Built Environment," World Renewable Energy Congress, Linköping, Sweden, May 8-13, 2011, Photovoltaic Technology (PV), Article No. 008, (057):2751-2758, Nov. 2011.

Verbunt et al., "The Effect of Dyes Aligned by Liquid Crystals on Luminescent Solar Concentrator Performance," 24th European Photovoltaic Solar Energy Conference, Hamburg, Germany, pp. 381-384, Sep. 2009.

Wang et al., "Size- and structure-dependent efficiency enhancement for luminescent solar concentrators," Journal of Photonics for Energy, 1(1):015502, Jan. 2011.

Weber and Lambe, "Luminescent greenhouse collector for solar radiation," Journal of Applied Optics, 15 (10):2299-2300, Oct. 1976.

Wilson et al., "Characterization and reduction of reabsorption losses in luminescent solar concentrators," Applied Optics, 49(9):1651-1661, Mar. 2010.

Wolarz et al., "Spectral properties and orientational order of tetrafluoro-pentenyl-perylene dye in uniformly aligned liquid-crystalline films," Journal of Molecular Structure, 990(1-3):169-175, Mar. 2011.

Zelinski and Uhlmann, "Gel technology in ceramics," Journal of Physics and Chemistry of Solids, 45 (10):1069-1090, 1984; retrieved Sep. 2017.

* cited by examiner

PHOTOLUMINESCENT SEMICONDUCTOR NANOCRYSTAL-BASED LUMINESCENT SOLAR CONCENTRATORS

CROSS-REFERENCE TO RELATED APPLICATIONS

This application claims the benefit of U.S. Patent Application No. 61/841,887, filed Jul. 1, 2013, and U.S. Patent Application No. 61/895,224, filed Oct. 24, 2013, the disclosures which are hereby incorporated by reference in their entireties.

STATEMENT OF GOVERNMENT LICENSE RIGHTS

This invention was made with Government support under DMR-1035512 and DMR-1206221, both awarded by the National Science Foundation. The Government has certain rights in the invention.

BACKGROUND

Luminescent solar concentrators (LSCs) collect and concentrate sunlight for use in solar power generation. LSCs are devices typically consisting of a planar waveguide coated or impregnated with a luminophore. Sunlight absorbed by the luminophore coated on or contained within the waveguide is re-emitted into the waveguide, where it is captured by total internal reflection, which causes it to travel to the edges to be concentrated for use by light conversion devices, such as photovoltaic cells (PVs). Unlike lens- and mirror-based concentrators, which require tracking systems to follow the sun's motion and can only concentrate direct, specular sunlight, LSCs are passive devices that work equally well with both diffuse and specular sunlight. They are therefore less costly to build, install, and maintain, more easily integrated into the built environment or portable solar energy systems, more damage tolerant, and can be used in climates where there is little direct sunlight. Furthermore, because LSCs can produce wavelength-to-bandgap matched photons by downshifting, there is reduced need for PV cooling, and multiple LSC waveguides each incorporating a different luminophore can be stacked to split the solar spectrum for tandem multi-cell conversion.

An exemplary LSC 10 is illustrated in FIG. 1, wherein the planar waveguide 12 comprises a plurality of luminophores 15. The planar waveguide 12 is edge-coupled to PV cells 14 sensitive to the emission wavelength of luminophores 15. As shown in the detail of FIG. 1, luminophores 15 absorb light 16 of a first wavelength, and emit light 18 of a second, red-shifted, wavelength. The emitted light 18 is used to generate electrical current in the PV cells 14.

In combination with bandgap-matched, high-efficiency PV cells, LSCs offer the potential for a reduction in the cost of solar electricity—by well over an order of magnitude. However, LSCs have thus far had little practical impact, primarily because the optical quantum efficiency (OQE) decreases rapidly with concentrator size (i.e., as an LSC increases in size, a smaller fraction of incident sunlight is concentrated at the edges). Several factors contribute to a decreasing OQE, two of which are usually dominant: (i) photon loss due to non-unity photoluminescence quantum yield (QY) of the luminophore and (ii) loss of photons from a top and bottom of the waveguide from emission at an angle inside the critical escape cone of the waveguide material, as defined by Snell's Law. For example, a typical organic luminophore-based LSC and a poly(methylmethacrylate) or glass waveguide can have a loss rate due to factor (i) that is near zero, but a loss rate due to factor (ii) that is about 25% per-emission. A decrease in OQE can also occur due to re-absorption and re-emission, as a captured photon traveling toward a waveguide edge may encounter other luminophores to be re-absorbed and re-emitted multiple times, and a fraction of photons can be lost with each successive re-absorption/re-emission event due to non-radiative relaxation processes. Repeating escape cone and QY losses thus compound with distance.

Previous efforts to address this problem have included the use of large-Stokes-shift luminophores that have a large energy difference between absorption and emission to reduce light re-absorption. Examples of such luminophores include certain organic dyes, quantum dots, lanthanide and transition metal-based molecules, and microcrystalline phosphors, and organic dyes whose emission is red-shifted by solid-state solvation. However, these luminophores tend to have low QY, narrow or weak spectral absorption bands that capture only a small portion of the solar spectrum, limited environmental lifetime, large scattering cross sections, or a combination of these shortcomings. Other methods for improving efficiency include the use of wavelength-selective mirrors and oriented luminophores for directing a larger portion of luminescence into waveguide modes and out of the escape cone. However, none of these approaches has proven successful in producing large area, high efficiency LSCs with long environmental lifetimes.

Accordingly, a large area, high efficiency LSC with a long environmental lifetime is needed. The present disclosure seeks to fulfill this need and provides further related advantages.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

In one aspect, this disclosure features an LSC including a plurality of photoluminescent nanoparticles. Each photoluminescent nanoparticle includes a semiconductor nanocrystal and a nanocrystal defect. The nanocrystal defect and the semiconductor nanocrystal combine to produce a photoluminescence effect. The defect can include an atom, a cluster of atoms, a lattice vacancy, and any combination thereof. The waveguide material has the plurality of photoluminescent particles suspended therein or applied to a surface thereof.

In another aspect, this disclosure features a window pane, a coating, a free-standing polymer film, an electronic display, and/or a touch screen including the LSC.

DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein:

FIG. 4A is a schematic representation of a monolithic photoluminescent nanoparticle. FIG. 4B is a schematic representation of a photoluminescent nanoparticle having a core surrounded by three shell layers. FIG. 4C is a schematic representation of a photoluminescent nanoparticle having a core surrounded by a shell.

FIG. 5 also shows a photoluminescence excitation (PLE) of an embodiment of photoluminescent nanoparticles.

FIG. 12A: LSC including Mn:ZnSe/ZnS photoluminescent nanoparticles. FIG. 12B: LSC including Mn:CdZnSe/ZnS photoluminescent nanoparticles. FIG. 12C: LSC including Cu:CdSe/CdS photoluminescent nanoparticles.

FIG. 13A: Mn:ZnSe/ZnS photoluminescent nanoparticles. FIG. 13B: Mn:CdZnSe/CdS photoluminescent nanoparticles. FIG. 13C: Cu:CdSe/CdS photoluminescent nanoparticles.

FIG. 14A: LSC including MnCdZnSe/CdS photoluminescent nanoparticles. FIG. 14B: LSC including Mn:ZnSe/ZnS photoluminescent nanoparticles. FIG. 14C: LSC including Cu:CdSe/CdS photoluminescent nanoparticles.

FIG. 15A: LSC including Mn-doped core-shell ZnSe/ZnS photoluminescent nanoparticles. FIG. 15B: LSC including alloy $Zn_{1-x-y}Cd_xMn_ySe$ photoluminescent nanoparticles.

FIGS. 16A and 16B are normalized emission spectra taken as a function of excitation distance from the edge of liquid-filled LSCs including embodiments of photoluminescent nanoparticles. LSCs were illuminated using a point excitation source. Each line represents an emission spectrum collected using a different distance between the excitation point and collection edge, with the distance ranging from 0.01 in. to 2.0 in. in FIG. 16A, and from 0.3 in. to 1.3 in. in FIG. 16B. FIG. 16A: LSC including $Zn_{1-x-y}Cd_xMn_ySe$ photoluminescent nanoparticles. FIG. 16B: LSC including Mn-doped core-shell ZnSe/ZnS photoluminescent nanoparticles. The spectra exhibit no significant red-shifting with increasing excitation distance, indicating little to no self-absorption.

DETAILED DESCRIPTION

Figure 1:
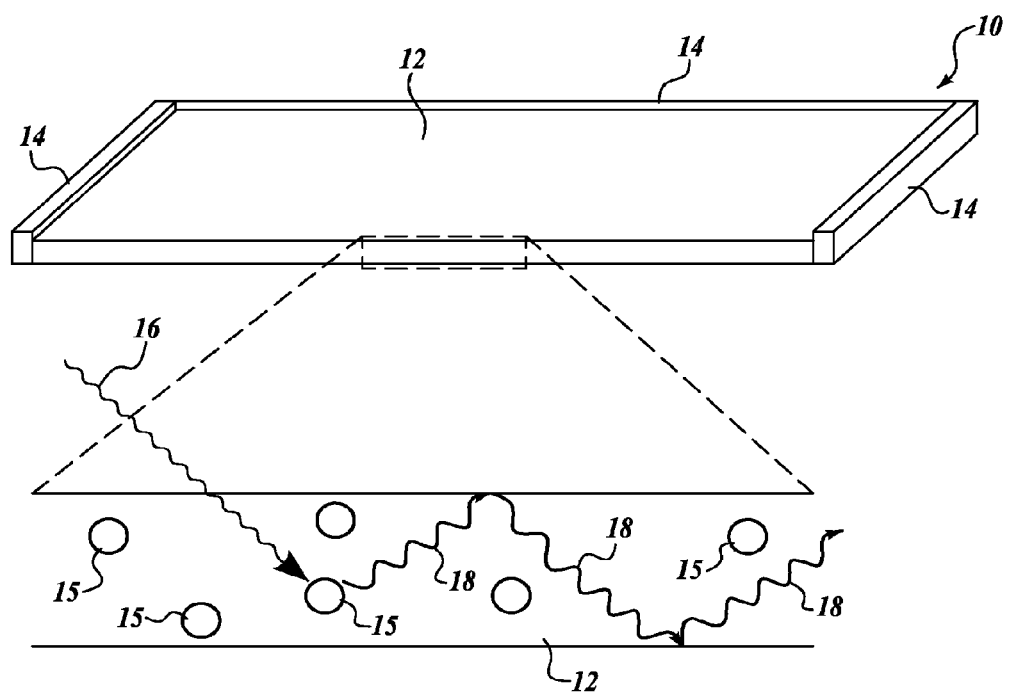
FIG. 1 is a schematic representation of a representative luminescent solar concentrator (LSC) as known in the prior art.

The present disclosure describes LSCs that include photoluminescent nanoparticles. The photoluminescent nanoparticles include a semiconductor nanocrystal that is associated with a defect. The defect can include, for example, an atom, a cluster of atoms, or a lattice vacancy. When the defect is an atom or a cluster of atoms, the defect can be incorporated into the semiconductor nanocrystal, adsorbed onto, or otherwise associated to the surface of the semiconductor nanocrystal. When the defect is a lattice vacancy, the defect can be present within or on a surface of the semiconductor nano crystal.

The semiconductor nanocrystal and the defect combine to provide a photoluminescent material. For example, the semiconductor nanocrystal can absorb photons and transfer its energy to the defect, which can then emit light at a wavelength that is different from the absorption wavelengths. In an idealized scenario, the photoluminescent nanoparticles should maximize absorption of incident irradiation (e.g., solar irradiation) and emission, should have a photoluminescence QY that approaches as close to 100% as possible, and should have minimal re-absorption and scattering of emitted light.

It is believed that one of the benefits of the present photoluminescent nanoparticles is the wide spectral gap between the wavelengths at which the photoluminescent nanoparticles absorb and emit light, which leads to little to no self-absorption. Another benefit of the photoluminescent nanoparticles is their rapid energy localization at the defect, which can outcompete other trapping, photochemical, or nonradiative decay processes that reduce the photoluminescence QY or degrade the materials. Other benefits of the photoluminescent nanoparticles include superior environmental lifetime compared to organic luminophores as a result of their resistance to photochemical bleaching; the use of abundant, low-cost starting materials in their preparation; their compatibility with a wide range of solvents, waveguide matrix materials, and processing methods; reduced light scattering compared to luminophores that include certain other nanoparticles, and in many cases the absence of toxic elements or other potentially harmful compounds. The photoluminescent nanoparticles can absorb light over a broad spectral range. In addition, the absorbance range and emission spectrum can each be tuned through the composition, structure, or size of the nanoparticles.

Definitions

At various places in the present specification, substituents of compounds of the disclosure are disclosed in groups or in ranges. It is specifically intended that the disclosure include each and every individual subcombination of the members of such groups and ranges. For example, the term "$C_{1-6}$ alkyl" is specifically intended to individually disclose methyl, ethyl, $C_3$ alkyl, $C_4$ alkyl, $C_5$ alkyl, and $C_6$ alkyl.

It is further appreciated that certain features of the disclosure, which are, for clarity, described in the context of separate embodiments, can also be provided in combination in a single embodiment.

Conversely, various features of the disclosure which are, for brevity, described in the context of a single embodiment, can also be provided separately or in any suitable subcombination.

As used herein, "photoluminescent" refers to light emission from a material after the absorption of photons and encompasses fluorescence and phosphorescence.

As used herein, "nanocrystal" refers to a crystal having its largest dimension smaller than or equal to about 100 nm, and composed of atoms in a crystalline arrangement.

As used herein, "nanoparticle" refers to a particle having its largest dimension smaller than or equal to about 100 nm.

As used herein, "semiconductor" refers to a material that has a band gap energy that overlaps with the spectrum of solar radiation at the Earth's surface. In general, a semiconductor has a band gap between that of a metal and that of an insulator, although it is appreciated that there is no rigorous distinction between insulators and wide-gap semiconductors.

As used herein, "defect" or "dopant" refers to a crystallographic defect, where the arrangement of atoms or molecules in a crystalline material departs from perfection by addition or exclusion of an ion, impurity atom, or small clusters of ions or atoms. The defect can occur at a single lattice point in the form of a vacancy, an interstitial defect, or an impurity. In some embodiments, the crystalline lattice has small clusters of atoms that form a separate phase (i.e., a precipitate).

The defect can be associated with a semiconductor nanocrystal. When the defect is an atom or a cluster of atoms, "associated with" refers to an atom or a cluster of atoms that is incorporated into the semiconductor nanocrystal, adsorbed onto, or otherwise associated (e.g., ionically bound, covalently bound) to the surface of the semiconductor nanocrystal. When the defect is a lattice vacancy, "associated with" refers to a lattice vacancy that is present within or on a surface of the semiconductor nanocrystal.

As used herein, "cluster of atoms" refers to an aggregate of atoms, the aggregate has a maximum dimension of less than or equal to 1 nm.

As used herein, light of shorter wavelength is considered "blue," "bluer," or "blue-shifted" when compared to light of a longer wavelength, which is "red," "redder," or "red-shifted," even if the specific wavelengths compared are not technically blue or red.

As used herein, "heterostructure" refers to a particle including at least two crystalline materials having an interface between the two crystalline materials.

As used herein, "alloy" refers to a single-phase mixture or a single-phase solid solution including at least two different materials (e.g., a semiconductor material).

As used herein, "passivation" refers to coating of a protective material or layer of molecules that reduces or eliminates deleterious surface trap states and protects against corrosion events such as oxidation.

As used herein, "core-shell" refers to an onion-like structure where a nanocrystal or nanoparticle has a central core surrounded by one or more concentric shell layers.

As used herein, "aliovalent" substitution is where the atom that is replacing an original atom in a crystal lattice has a different oxidation state as the atom it is replacing.

As used herein, "isovalent" substitution is where the atom that is substituting the original atom in a crystal lattice has the same oxidation state as the atom it is replacing.

As used herein, "capping molecule" or "surface-capping molecule" refers to a molecule on a surface of a nanoparticle having a functional group that is covalently or non-covalently bound (e.g., ionically bound, bound via hydrogen-bonds or van der Waals interactions) to the nanoparticle via the functional group.

As used herein, "average maximum dimension" refers the average maximum length of a nanoparticle or nanocrystal, obtained by measuring a maximum dimension (along any given direction) of each nanoparticle or nanocrystal in an ensemble of nanoparticles or nanocrystals, and averaged amongst the measured nanoparticles or nanocrystals. The dimension can be measured by various techniques including transmission electron microscopy or scanning electron microscopy, and the ensemble of nanoparticles or nanocrystals used for this determination typically includes at least 100 nano crystals.

As used herein, "surface roughness" refers the average root-mean-squared deviation in the height of a surface over an area of approximately 100 microns$^2$.

As used herein, "optical quantum efficiency" (OQE) refers to the fraction of incident photons absorbed by the photoluminescent species (e.g., nanoparticles) in an LSC that is emitted from the concentrator edge.

As used herein, "photoluminescence quantum yield" or "quantum yield" (QY) refer to the ratio of the number of emitted photons per number of absorbed photons.

As used herein, "oligomer" or "polymer" refers to a molecule having between 3 and 10,000 constitutional units.

As used herein, the term "copolymer" refers to a polymer that is the result of polymerization of two or more different monomers. The number and the nature of each constitutional unit can be separately controlled in a copolymer. The constitutional units can be disposed in a purely random, an alternating random, a regular alternating, a regular block, or a random block configuration unless expressly stated to be otherwise. A purely random configuration can, for example, be: x-x-y-z-x-y-y-z-y-z-z-z . . . or y-z-x-y-z-y-z-x-x . . . . An alternating random configuration can be: x-y-x-z-y-x-y-z-y-x-z . . . , and a regular alternating configuration can be: x-y-z-x-y-z-x-y-z . . . . A regular block configuration has the following general configuration: . . . x-x-x-y-y-y-z-z-z-x-x-x . . . , while a random block configuration has the general configuration: . . . x-x-x-z-z-x-x-y-y-y-z-z-z-x-x-z-z-z- . . . .

As used herein, the term "constitutional unit" of an oligomer or polymer refers an atom or group of atoms in an oligomer or polymer, including a part of the chain together with its pendant atoms or groups of atoms, if any. The constitutional unit can refer to a repeat unit. The constitutional unit can also refer to an end group on an oligomer or polymer chain. For example, the constitutional unit of polyethylene glycol can be —$CH_2CH_2O$— corresponding to a repeat unit, or —$CH_2CH_2OH$ corresponding to an end group.

As used herein, the term "repeat unit" corresponds to the smallest constitutional unit, the repetition of which constitutes a regular macromolecule (or oligomer molecule or block)

As used herein, the term "end group" refers to a constitutional unit with only one attachment to an oligomer or polymer chain, located at the end of an oligomer or polymer. For example, the end group can be derived from a monomer unit at the end of the oligomer or polymer, once the monomer unit has been polymerized. As another example, the end group can be a part of an initiating agent that was used to synthesize the polymer.

As used herein, the term "substituted" or "substitution" is meant to refer to the replacing of a hydrogen atom with a substituent other than H. For example, an "N-substituted piperidin-4-yl" refers to replacement of the H atom from the NH of the piperidinyl with a non-hydrogen substituent such as, for example, alkyl.

As used herein, the term "alkyl" refers to a straight or branched chain fully saturated (no double or triple bonds) hydrocarbon (carbon and hydrogen only) group. Examples of alkyl groups include, but are not limited to, methyl, ethyl, propyl, isopropyl, butyl, isobutyl, sec-butyl, tertiary butyl, pentyl and hexyl. As used herein, "alkyl" includes "alkylene" groups, which refer to straight or branched fully saturated hydrocarbon groups having two rather than one open valences for bonding to other groups. Examples of alkylene groups include, but are not limited to methylene, —$CH_2$—, ethylene, —$CH_2CH_2$—, propylene, —$CH_2CH_2CH_2$—, n-butylene, —$CH_2CH_2CH_2CH_2$—, sec-butylene, and —$CH_2CH(CH_3)$—. An alkyl group of this disclosure may optionally be substituted with one or more fluorine groups.

As used herein, "alkenyl" refers to an alkyl group having one or more double carbon-carbon bonds. Examples of alkenyl groups include ethenyl, propenyl, and the like. The term "alkenylenyl" refers to a divalent linking alkenyl group.

As used herein, "haloalkyl" refers to an alkyl group having one or more halogen substituents. Example of haloalkyl groups include $CF_3$, $C_2F_5$, $CHF_2$, $CCl_3$, $CHCl_2$, $C_2Cl_5$, and the like.

As used herein, the term "aryl" refers to monocyclic or polycyclic (e.g., having 2, 3 or 4 fused rings) aromatic hydrocarbons such as, for example, phenyl, naphthyl, anthracenyl, phenanthrenyl, indanyl, and indenyl. In some embodiments, aryl groups have from 6 to about 20 carbon atoms.

As used herein, the term "halo" or "halogen" includes fluoro, chloro, bromo, and iodo.

As used herein, "heteroaryl" groups refer to an aromatic heterocycle having at least one heteroatom ring member such as sulfur, oxygen, or nitrogen. Heteroaryl groups include monocyclic and polycyclic (e.g., having 2, 3 or 4 fused rings) systems. Examples of heteroaryl groups include without limitation, pyridyl, pyrimidinyl, pyrazinyl, pyridazinyl, triazinyl, furyl, quinolyl, isoquinolyl, thienyl, imidazolyl, thiazolyl, indolyl, pyrryl, oxazolyl, benzofuryl, benzothienyl, benzthiazolyl, isoxazolyl, pyrazolyl, triazolyl, tetrazolyl, indazolyl, 1,2,4-thiadiazolyl, isothiazolyl, benzothienyl, purinyl, carbazolyl, benzimidazolyl, indolinyl, and the like. In some embodiments, the heteroaryl group has from 1 to about 20 carbon atoms, and in further embodiments from about 3 to about 20 carbon atoms. In some embodiments, the heteroaryl group contains 3 to about 14, 3 to about 7, or 5 to 6 ring-forming atoms. In some embodiments, the heteroaryl group has 1 to about 4, 1 to about 3, or 1 to 2 heteroatoms.

As used herein, "heterocycloalkyl" refers to non-aromatic heterocycles including cyclized alkyl, alkenyl, and alkynyl groups where one or more of the ring-forming carbon atoms are replaced by a heteroatom such as an oxygen, nitrogen, or sulfur atom. Heterocycloalkyl groups can be mono- or polycyclic (e.g., having 2, 3, 4 or more fused rings or having a 2-ring, 3-ring, 4-ring spiro system (e.g., having 8 to 20 ring-forming atoms). Heterocycloalkyl groups include monocyclic and polycyclic groups. Example "heterocycloalkyl" groups include morpholino, thiomorpholino, piperazinyl, tetrahydrofuranyl, tetrahydrothienyl, 2,3-dihydrobenzofuryl, 1,3-benzodioxole, benzo-1,4-dioxane, piperidinyl, pyrrolidinyl, isoxazolidinyl, isothiazolidinyl, pyrazolidinyl, oxazolidinyl, thiazolidinyl, imidazolidinyl, and the like. Ring-forming carbon atoms and heteroatoms of a heterocycloalkyl group can be optionally substituted by oxo or sulfido. Also included in the definition of heterocycloalkyl are moieties that have one or more aromatic rings fused (i.e., having a bond in common with) to the nonaromatic heterocyclic ring, for example phthalimidyl, naphthalimidyl, and benzo derivatives of heterocycles such as indolene and isoindolene groups. In some embodiments, the heterocycloalkyl group has from 1 to about 20 carbon atoms, and in further embodiments from about 3 to about 20 carbon atoms. In some embodiments, the heterocycloalkyl group contains 3 to about 14, 3 to about 7, or 5 to 6 ring-forming atoms. In some embodiments, the heterocycloalkyl group has 1 to about 4, 1 to about 3, or 1 to 2 heteroatoms. In some embodiments, the heterocycloalkyl group contains 0 to 3 double bonds. In some embodiments, the heterocycloalkyl group contains 0 to 2 triple bonds.

Unless otherwise defined, all technical and scientific terms used herein have the same meaning as commonly understood by one of ordinary skill in the art. Although methods and materials similar or equivalent to those described herein can be used in the practice or testing of the present disclosure, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

Photoluminescent Nanoparticles

In one aspect, the present disclosure describes an LSC including photoluminescent nanoparticles that are suspended in a waveguide material or applied to a surface of a waveguide material. The photoluminescent nanoparticles include a semiconductor nanocrystal and one or more defects. The defect and the semiconductor nanocrystal together produce a photoluminescent effect. The defect is an atom, a cluster of atoms, a lattice vacancy, or a combination thereof. As an example, a given semiconductor nanocrystal can include one type of defect, such as an atom, a cluster of atoms, or a lattice vacancy. As another example, a given semiconductor nanocrystal can include two or more types of defects.

In some embodiments, the defect is an atom.

In some embodiments, the defect is a cluster of atoms.

In some embodiments, the defect is a lattice vacancy.

In some embodiments, the defect includes an atom and a cluster of atoms.

In some embodiments, the defect includes an atom and a lattice vacancy.

In some embodiments, the defect includes a cluster of atoms and a lattice vacancy.

In some embodiments, the defect includes an atom, a cluster of atoms, and a lattice vacancy.

The defect can be associated in any manner with the semiconductor nanocrystal. When the defect is an atom or a cluster of atoms, the defect can be incorporated into the semiconductor nanocrystal, adsorbed onto, or otherwise associated (e.g., ionically bound, covalently bound) to the surface of the semiconductor nanocrystal. When the defect is a lattice vacancy, the defect can be present within or on a surface of the semiconductor nano crystal.

Figure 2:
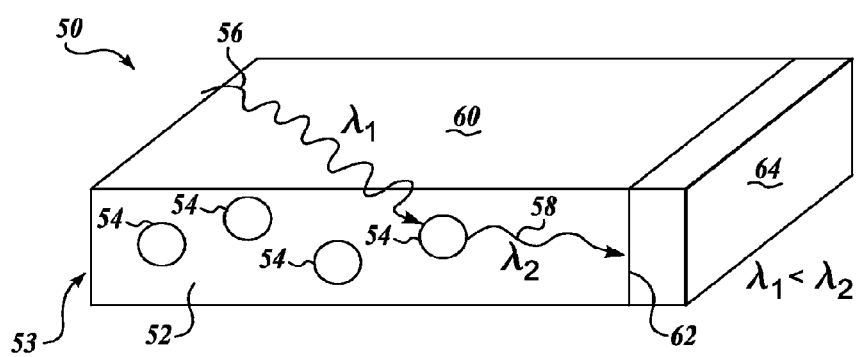
FIG. 2 is a schematic representation of an embodiment of an LSC.

An exemplary LSC 50 is shown in FIG. 2. LSC 50 includes a waveguide layer 53 having a plurality of photoluminescent nanoparticles 54 in a waveguide material 52. In certain embodiments, the photoluminescent nanoparticles 54 are "guests" in a "host" waveguide material 52 (i.e., a "guest-host" system), as illustrated in FIG. 2. In other embodiments, the entire waveguide layer 53 is formed from a single material that has photoluminescent nanoparticles 54 attached (e.g., conjugated) to the waveguide material 52.

The photoluminescent nanoparticles 54 absorb incident light 56 and photoluminesce emitted light 58. The incident light 56 has a wavelength $\lambda_1$ and emitted light 58 has a wavelength $\lambda_2$ that is longer than $\lambda_1$.

As used herein, with regard to planar waveguides, the planar surface (such as surface 60) is sometimes referred to as a "major surface" of the waveguide or device. A typical planar waveguide has two major surfaces (e.g., a top and bottom surface). A planar waveguide has minor surfaces at the edges. In a typical LSC based on a planar waveguide, light from the luminophores is collected by PVs in optical communication with the edge(s) of the LSC planar waveguide.

In the exemplary LSC illustrated in FIG. 2, the incident light 56 enters the waveguide layer 53 through the major surface 60. After conversion of the light via phosphorescence or fluorescence, the emitted light 58 is essentially trapped in the waveguide layer 53 by total internal reflection. A portion of the emitted light 58 travels through the waveguide layer 53 to an edge 62 of the waveguide layer 53, where it is utilized by a light conversion device 64.

Figure 3A:
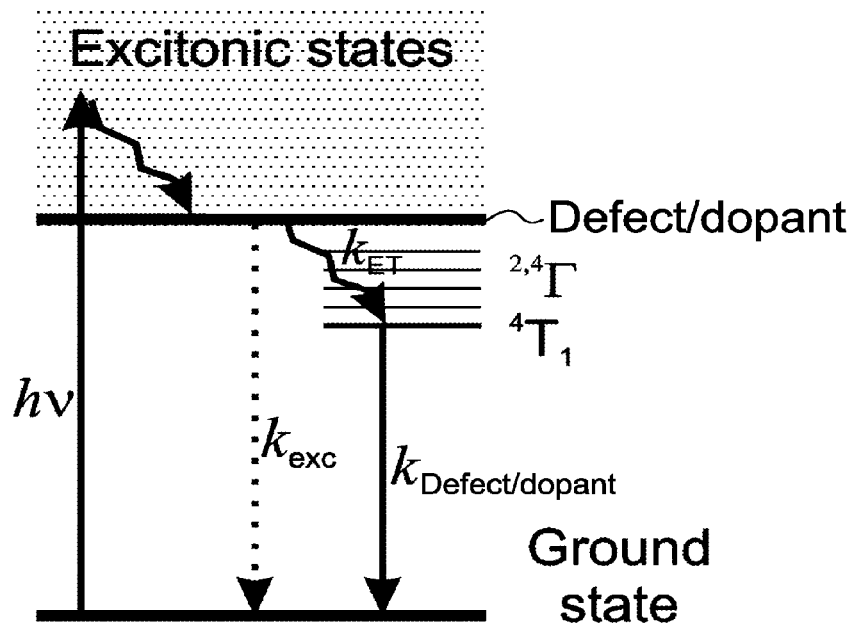
FIG. 3A is a schematic representation of an emission process of an embodiment of an LSC.

The photoluminescent nanoparticles are characterized by very large energy shifts between absorption and photoluminescence maxima arising from rapid nonradiative energy localization at the defect. In some embodiments, the photoluminescent nanoparticles can luminesce following the light absorption and emission energy diagram provided in FIG. 3A. Referring to FIG. 3A, absorption of a photon hv by a semiconductor nanocrystal can produce an exciton whose energy is rapidly and efficiently transferred to an excited state of the defect. Following energy transfer, the excited defect can then radiatively relax to a ground state. The defect can have an absorption cross-section at emission wavelengths that is more than approximately $10^3$ times smaller (e.g., approximately $10^4$ times smaller, approximately $10^5$ times smaller, or approximately $10^6$ times smaller) than that of the associated semiconductor nanocrystal, while also having a high efficiency luminescence from an excited state whose energy lies below the bandgap of the semiconductor nanocrystal. In some embodiments, the defect's excited state can relax radiatively in a near-complete or complete manner, with small to negligible nonradiative decay at ambient temperatures. Referring again to FIG. 3A, the emissive excited state can be sufficiently lower in energy compared to the lowest excited state of the semiconductor nanocrystal such that thermally-activated transfer of energy back to the nanocrystal is negligible at temperatures near ambient temperature. This can help achieve negligible thermally-activated nonradiative decay, enabling very high QYs.

Figure 3B:
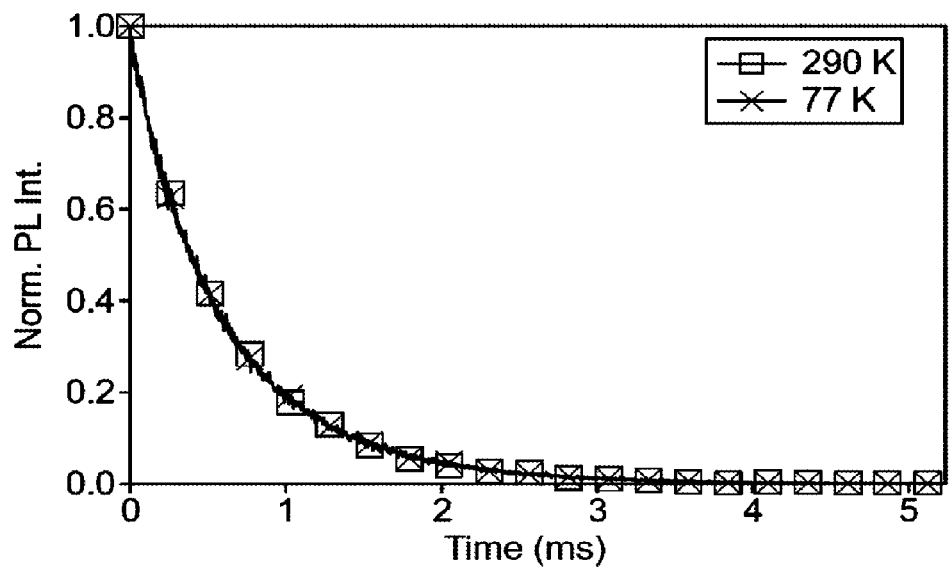
FIG. 3B shows two photoluminescence (PL) decay curves of an embodiment of photoluminescent nanoparticles. The two decay curves are indistinguishable, consistent with negligible thermally activated nonradiative decay. The photoluminescent nanoparticles have a 100% photoluminescence quantum yield (QY), measured at 290 and 77 K.

As an example, referring to FIG. 3B, time-resolved photoluminescence decay curves of an exemplary photoluminescent nanoparticle (Mn:$Zn_{1-x}Cd_xSe$/ZnS) are shown at 290K and 77K. Negligible thermally-activated nonradiative decay can be seen by the nearly identical decay curves at 290K and 77K. The nanoparticles have a 100% photoluminescence QY.

Figure 4A:
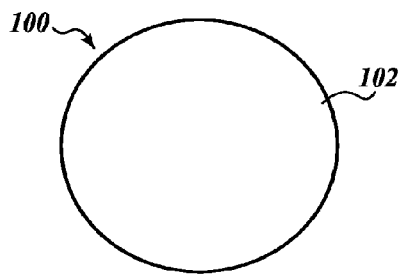
FIGS. 4A-4C are schematic representations of embodiments of photoluminescent nanoparticles.

The photoluminescent nanoparticles can be monolithic nanocrystals. As used herein, the term "monolithic" refers to a crystal that consists of a single type of material. For example, referring to FIG. 4A, a photoluminescent nanoparticle 100 (e.g., $Zn_{1-x-y}Cd_xMn_ySe$) is monolithic and has one material 102. Monolithic photoluminescent nanoparticles include two or more elements, and can include dopants, as well.

Figure 4B:
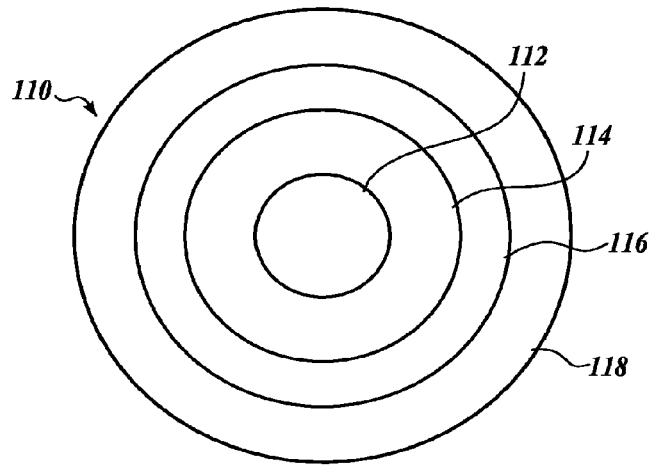
Figure 4C:
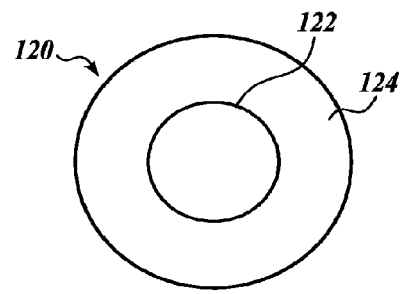

In other embodiments, the photoluminescent nanoparticles include a core and one or more shell layers, as illustrated in FIGS. 4B and 4C. Any number of shell layers may be incorporated. Referring to FIGS. 4B and 4C, the composition of the core 112 or 122 and the first shell layer 114 or 124 (closest to the core), respectively is different. Subsequent shell layers can be the same material as the core or different. As illustrated in the FIG. 4B, in certain embodiments, two shell layers 114 and 118 have the same composition and are separated by at least one shell layer 116 having a different composition. An example of a core-shell semiconductor nanocrystal includes ZnSe/ZnS. Another example of a core-shell semiconductor nanocrystal includes ZnSe/ZnS/CdS/ZnS, where each "I" denotes a heterostructure or a gradient alloy of materials forming the semiconductor crystal and the first compound indicates the core. For example, ZnSe/ZnS/CdS/ZnS represents a nanoparticle having a ZnSe core that is overlaid with a first layer of ZnS, a second layer of CdS, and a third layer of ZnS.

The semiconductor nanocrystal of the photoluminescent nanoparticle, whether monolithic or having a core-shell structure, can include any of a variety of semiconductor materials. For example, the semiconductor nanocrystal can include semiconductor II-VI materials (e.g., CdSe, CdS, CdTe, ZnSe, ZnS, ZnTe, alloys thereof, and heterostructures thereof); semiconductor I-VI materials (e.g., InN, InP, AlGaAs, InGaAs, alloys thereof, and heterostructures thereof); semiconductor I-VI materials (e.g., CuS, $Ag_2S$, alloys thereof, and heterostructures thereof); and/or compound semiconductor materials (e.g., $CuInSe_2$, $CuInS_2$ and $In_2S_3$, alloys thereof, and heterostructures thereof). In some embodiments, the photoluminescent nanoparticle includes CdSe, CdS, CdTe, ZnSe, ZnS, ZnTe, InN, InP, AlGaAs, InGaAs, CuS, $Ag_2S$, $CuInSe_2$, $CuInS_2$, $In_2S_3$, GaP, InP, GaN, AlN, GaAs, PbS, PbSc, PbTc, CuCl, $Cu_2S$, $Cu_2Sc$, $Cu_2ZnSnS_4$, $Cu_2ZnSnSc_4$, $Cu_2ZnSnTe_4$, $CuInTe_2$, Si, Ge, $Y_2O_3$, $Y_2S_3$, $Y_2Se_3$, $NaYF_4$, $NaYS_2$, $LaF_3$, $YF_3$, ZnO, $TiO_2$, $La_2O_2S$, $Y_2O_2S$, $Gd_2O_2S$, $Zn_3N_2$, $Zn_3P_2$, and/or alloys or heterostructures thereof. The semiconductor materials can be used singly or in any combination.

The photoluminescent nanoparticles have a small amount of defect that is in intimate contact with the semiconductor nanocrystal. The defect can include an atom, or a cluster of atoms, at any oxidation state. For example, the atom or cluster of atoms can include an emissive transition-metal element (e.g., Mn, Co, Cr, V, Fe, Ni, and/or Cu), a donor-acceptor luminescence activator element (e.g., Ag, Au, Al, Bi, Sb, Cl, Br, and/or I), and/or certain lanthanide elements (e.g., Ce, Pr, Nd, Sm, Eu, Tb, Dy, Ho, Er, Tm, or Yb). In some embodiments, the atom or cluster of atoms can include Mn, Co, Cu, Pt, Ru, V, Cr, Ag, Au, Al, Bi, Sb, Cl, Br, I, Ce, Pr, Nd, Sm, Eu, Tb, Dy, Ho, Er, Tm, and/or Yb. For example, the atom or cluster of atoms can include $Mn^{2+}$, $Yb^{3+}$, $Nd^{3+}$, $Cu^+$, $Cl^-$, $Ag^+$, $Er^{3+}$, $Eu^{2+}$, and/or $Cr^{3+}$.

In some embodiments, the defect is Mn.

In some embodiments, the defect is Cu.

In some embodiments, the defect is a lanthanide. It is believed that lanthanides can have sharp emission spectra that can extend in some cases into the near-infrared. For example, $Yb^{3+}$ undergoes efficient luminescence at 980 nm, making it well-matched to the peak responsivity of Si PVs.

The atom or cluster of atoms can be located at a regular lattice site in a crystal structure of a given semiconductor crystal (i.e., a substitutional defect). In some embodiments, the atom or cluster of atoms can be found at or close to the lattice site(s) of the atom(s) it is replacing. In some embodiments, the defect can be an interstitial defect, where an atom occupies a site in the crystal structure at which there is usually not an atom. The substitution of atom or cluster of atoms can be isovalent or aliovalent.

Without wishing to be bound by theory, it is believed that one or more mechanisms contribute to a reduction of self-absorption, when the defect is an atom or cluster of atoms. For example, an optically-induced electronic transition from a nanocrystal ground state to an excited emissive state can be spin-forbidden in a photoluminescent nanoparticle (e.g., Mn-doped ZnSe (Mn:ZnSe)). As another example, a low concentration of an emissive species can result in reduced self-absorption (e.g., Cu-doped CdSe (Cu:CdSe)). As yet another example, a large excited-state nuclear reorganization of an emissive species can reduce self-absorption (e.g., Cu-doped CdSe (Cu:CdSe)). In some embodiments, first-order parity forbiddenness of an optically induced electronic transition from a nanocrystal ground state to an excited emissive state can limit self-absorption (e.g., Yb-doped PbS (Yb:PbS)). Other mechanisms may also contribute to reduced self-absorption.

In some embodiments, the defect is a lattice vacancy. The lattice vacancy can include an atomic vacancy, where an atom is missing from the crystallographic lattice of the semiconductor crystal (i.e., a Schottky defect). For example, in a CdSe crystal, the atomic vacancy can be an absence of Cd and/or Se at their corresponding lattice sites. In some embodiments, the lattice vacancy is an oxygen vacancy, a selenium vacancy, a sulfur vacancy, a phosphorus vacancy, or a tellurium vacancy.

In some embodiments, the photoluminescent nanoparticles are Mn-doped ZnSe/ZnS/CdS/ZnS (Mn:ZnSe/ZnS/CdS/ZnS), Cu-doped InP/ZnS (Cu:InP/ZnS), $Zn_{1-x-y}Cd_xMn_ySe/ZnS$, Yb-doped Si/SiO$_2$ (Yb: Si/SiO$_2$), Yb-doped NaYF$_4$/CdSe/ZnSe (Yb: NaYF$_4$/CdSe/ZnSe), $Cu_xZn_yIn_zSe_{2-\delta}$, and/or Yb-doped CdTe/ZnS (Yb:CdTe/ZnS). In some embodiments, when the photoluminescent nanoparticles are $Zn_{1-x-y}Cd_xMn_ySe/ZnS$, x and y can have values such that $1-x-y>x+y$ and $x>y$. For example, x can be about 0.1 and y can be about 0.01 in $Zn_{1-x-y}Cd_xMn_ySe/ZnS$. In some embodiments, when the photoluminescent nanoparticles are $Cu_xZn_yIn_zSe_{2-\delta}$, the ratio of y:z can range from about 0 (e.g., from about 0.1, from about 0.2, from about 0.3, or from about 0.4) to about 0.5 (e.g., to about 0.4, to about 0.3, to about 0.2, or to about 0.1), and x/(y+z) can be about 0.05). As used herein, when a formula includes a semicolon ";", it is understood that the elements preceding the semicolon represent the dopant, while elements following the semicolon represent the semiconductor crystal. "/" denotes a heterostructure or a gradient alloy of materials forming the semiconductor crystal.

In some embodiments, the photoluminescent nanoparticles are Mn-doped ZnSe. The Mn-doped ZnSe photoluminescent nanoparticles can optionally include one or more layers (e.g., a passivation layer, a wide-gap nanocrystal layer, a capping molecule layer, and/or an inorganic molecule layer) on the surface of the photoluminescent nanoparticles, such as a ZnS layer.

In some embodiments, the photoluminescent nanoparticles are Mn-doped ZnSe/ZnS.

In some embodiments, the photoluminescent nanoparticles are Mn-doped CdZnSe. The Mn-doped ZnSe/ZnS photoluminescent nanoparticles can optionally include one or more layers (e.g., a passivation layer, a wide-gap nanocrystal layer, a capping molecule layer, and/or an inorganic molecule layer) on the surface of the photoluminescent nanoparticles, such as a ZnS layer.

In some embodiments, the photoluminescent nanoparticles are Mn-doped CdZnSe/CdS.

In some embodiments, the photoluminescent nanoparticles are Cu-doped CdSe. The Cu-doped CdSe photoluminescent nanoparticles can optionally include one or more layers (e.g., a passivation layer, a wide-gap nanocrystal layer, a capping molecule layer, and/or an inorganic molecule layer) on the surface of the photoluminescent nanoparticles, such as a CdS layer.

In some embodiments, the photoluminescent nanoparticles are Cu-doped CdSe/CdS.

In some embodiments, the photoluminescent nanoparticles are $Zn_{1-x-y}Cd_xMn_ySe$, where x and y have values such that $1-x-y>x+y$ and $x>y$. For example, x can be about 0.1 and y can be about 0.01 in $Zn_{1-x-y}Cd_xMn_ySe/ZnS$. The $Zn_{1-x-y}Cd_xMn_ySe$ photoluminescent nanoparticles can optionally include one or more layers (e.g., a passivation layer, a wide-gap nanocrystal layer, a capping molecule layer, and/or an inorganic molecule layer) on the surface of the photoluminescent nanoparticles.

In some embodiments, the defect is present at a mole fraction of 10% or less (e.g., 8% or less, 6% or less, 4% or less, 2% or less, or 1% or less) and/or 0.05% or more (e.g., 1% or more, 2% or more, 4% or more, 6% or more, or 8% or more) relative to the constituents of (i.e., the atoms forming) the semiconductor nanocrystal. For example, a cation defect can be present in a cation mole fraction of about 1% in the semiconductor nano crystal.

In some embodiments, the photoluminescent nanoparticle includes a passivation layer on a surface of the nanocrystal. The passivation layer can include a material such as CdSe, CdS, CdTe, ZnSe, ZnS, ZnTe, InN, InP, AlGaAs, InGaAs, CuS, Ag$_2$S, CuInSc$_2$, CuInS$_2$, In$_2$S$_3$, GaP, InP, GaN, AlN, GaAs, PbS, PbSe, PbTe, CuCl, Cu$_2$S, Cu$_2$Se, Cu$_2$ZnSnS$_4$, Cu$_2$ZnSnSe$_4$, Cu$_2$ZnSnTe$_4$, CuInTe$_2$, Si, Ge, Y$_2$O$_3$, Y$_2$S$_3$, Y$_2$Se$_3$, NaYF$_4$, NaYS$_2$, LaF$_3$, YF$_3$, ZnO, TiO$_2$, La$_2$O$_2$S, Y$_2$O$_2$S, Gd$_2$O$_2$S, Zn$_3$N$_2$, Zn$_3$P$_2$, and/or alloys thereof. For example, a CdS passivation layer can be present on a surface of a CdSe nanocrystal, a GaP passivation layer can be present on a surface of an InP nanocrystal, an alloy of ZnSe and CdS can be present on a surface of a CdSe nanocrystal. A given surface layer can be a suitable passivation layer if it is capable of isolating the photoluminescent nanoparticle from surface or external species that can directly or indirectly reduce the nanocrystal photoluminescence QY. Common criteria for an effective nanoparticle passivation layer include a material that is more robust against oxidation, that has a wider band gap than the nanocrystal, and/or that has no low-lying electronic states.

In some embodiments, the photoluminescent nanoparticle further includes a wide-gap nanocrystal, which has an energy gap that is larger than a targeted incident photon's energy. The wide-gap nanocrystal can form a heterostructure with a semiconductor of a different composition, to provide absorption of a targeted incident photon. For example, the wide-gap nanocrystal can include $NaYF_4$, $Gd_2O_2S$, $Y_2S_3$, and/or $CePO_4$. The wide-gap nanocrystal can include a dopant, such as Yb, which can be present at a mole fraction of 10% or less (e.g., 8% or less, 6% or less, 4% or less, 2% or less, or 1% or less) and/or 0.05% or more (e.g., 1% or more, 2% or more, 4% or more, 6% or more, or 8% or more) relative to the wide-gap semiconductor nanocrystal. For example, a cation dopant can be present in a cation mole fraction of about 1% relative to the constituents of (i.e., the atoms forming) the wide-gap nanocrystal.

In some embodiments, the photoluminescent nanoparticle further includes a capping molecule on a surface (i.e., a surface-capping molecule). A plurality of capping molecules can form a continuous or discontinuous layer on the photoluminescent nanoparticle. For example, the capping molecule can be an amine, an ammonium, a carboxylate, a phosphonate, a phosphine, a phosphine oxide, an oligomeric phosphine, a silane, a thiol, a dithiol, a disulfide, an N-containing heteroaryl, and/or an N-containing heterocycloalkyl, each of which is independently optionally substituted with a $C_{4-20}$ alkyl, $C_{4-20}$ alkenyl, aryl group, and any combination thereof. In some embodiments, a substituted capping molecule provides increased solubility in a waveguide matrix. In some embodiments, the capping molecule is dodecylamine, trioctylamine, oleylamine, trioctylphosphonate, trioctylphosphine oxide, trioctylphosphine, pyridine, acetate, stearate, myristate, and/or oleate. In certain embodiments, the capping molecule includes a reactive functional group such as an olefin, a silane, an acrylate, and/or an epoxide, wherein the reactive functional group can form a covalent bond with a polymer such as a polysilane, a polyacrylate polymer, a polyolefin, and/or a perfluorinated polyether.

The capping molecule on a photoluminescent nanoparticle surface can be an oligomer or a polymer. For example, the capping molecule can include an oligomer that includes functional groups located at the end groups of the oligomer, and/or as side chains on the repeat units of the oligomer. The functional groups can include phosphines, phosphine oxides, phosphonates, phosphine oxides, pyridines, amines, amides, carboxylic acids, and/or carboxylates such acetates, stearates, myristates, and/or oleates. Each of the phosphines, phosphine oxides, phosphonates, phosphine oxides, pyridines, amines, amides, carboxylates, and carboxylic acids can be independently optionally substituted with $C_{4-20}$ alkyl, $C_{4-20}$ alkenyl, aryl, or any combination thereof. An oligomer or polymer on a surface of the photoluminescent nanocrystal can include polysiloxanes, polyalkylphosphines, and/or polyarylphophines, which can include pendant groups such as alkyl phosphines, aryl phosphines, alkyl phosphine oxides, aryl phosphine oxides, phosphonates, pyridines, amines, amides, carboxylic acids, carboxylates, and/or thiols.

In certain embodiments, one or more capping molecule can be replaced with an inorganic molecule such as $BF_4^-$, $S^{2-}$, $HS^-$, $Se^{2-}$, $HSe^-$, $Te^{2-}$, $HTe^-$, $TeS_3^{2-}$, $OH^-$, and $NH_2^-$, $In_2Se_4^{2-}$, $SnTe_4^{4-}$, $AsS_3^{3-}$, $Sn_2S_6^{4-}$, $SCN^-$, and/or related inorganic molecules thereof, on a surface of the photoluminescent nanoparticle. In some embodiments, the related inorganic molecules include $Sn_2Se_6^{4-}$, $In_2S_4^{2-}$, $Ge_2Se_4^{2-}$, $SnSe_4^{2-}$, etc. It is believed that a wide variety of inorganic small-molecule capping agents can be used for the replacing the capping molecule. Examples of inorganic small molecules suitable for replacing the capping molecule are described in Nag A., et al., Metal-free Inorganic Ligands for Colloidal Nanocrystals: $S^{2-}$, $HS^-$, $Se^{2-}$, $HSe^-$, $Te^{2-}$, $HTe^-$, $TeS_3^{2-}$, $OH^-$, and $NH_2^-$ as Surface Ligands, *J. Am. Chem. Soc.* 2011, 133, 10612. Kovalenko M. V. et al., Colloidal Nanocrystals with Molecular Metal Chalcogenide Surface Ligands, *Science* 2009, 324, 1417-1420, Rosen E. L. et al., Exceptionally Mild Reactive Stripping of Native Ligands from Nanocrystal Surfaces by Using Meerwein's Salt, Angewandte Chemie, International Edition, 2012, 51, 684-689, each of which is herein incorporated by reference in its entirety. The inorganic small molecule capping agents can be used to provide solubility to the photoluminescent nanoparticle in polar solvents, and can render the photoluminescent nanoparticle more suitable for incorporating into oxides or other inorganic waveguides.

The photoluminescent nanoparticles can have a maximum dimension of about 100 nm or less, about 50 nm or less, about 10 nm or less, about 5 nm or less, or about 2 nm or less. In some embodiments, the photoluminescent nanoparticles have a maximum dimension of about 5 nm or less. In other embodiments, the photoluminescent nanoparticles have an average maximum dimension ranging from about 1 nm to about 100 nm (e.g., from about 1 nm to about 75 nm, from about 1 nm to about 50 nm, from about 1 nm to about 20 nm, from about 1 nm to about 10 nm, from about 1 nm to about 5 nm, from about 5 nm to about 75 nm, from about 5 nm to about 50 nm, from about 5 nm to about 25 nm, from about 5 nm to about 20, or from about 5 nm to about 10 nm.) The photoluminescent nanoparticle dimensions can be determined, for example, by transmission electron microscopy or scanning electron microscopy, or by x-ray diffraction line broadening (e.g., for small nanoparticles). Without wishing to be bound by theory, it is believed that light scattering processes can occur with increasing probability as a photon's optical path through a given material containing photoluminescent nanoparticles increases, when the index of refraction of the photoluminescent nanoparticle is different than that of the material in which the photon travels. A photoluminescent nanoparticle having a smaller maximum dimension can reduce light scattering. As used herein when describing a dimension, measurement, etc., the term "about" indicates a possible difference of +/−5%.

When the photoluminescent nanoparticle is a core/shell composition, the core can have a maximum dimension of about 100 nm or less, about 50 nm or less, about 10 nm or less, about 5 nm or less, or about 2 nm or less. In some embodiments, the core has a maximum dimension of about 5 nm or less. In other embodiments, the core has an average maximum dimension of from about 1 nm to about 100 nm. In some embodiments, each shell can have an average thickness of from about 0.2 nm to about 25 nm (e.g., from about 0.2 nm to about 15 nm, from about 0.2 nm to about 10 nm, from about 5 nm to about 25 nm, from about 5 nm to about 15 nm, from about 0.5 nm to about 15 nm, from about 10 nm to about 15 nm). Shell thicknesses can be determined by measuring the size of the particles before and after shell growth, for example, using electron microscopy.

In some embodiments, the combined core and shell dimension is such that the total maximum nanoparticle dimension is sufficiently small to have decreased (e.g., avoid) photon scattering. For example, for doped semiconductor nanoparticles in polymer matrices, the combined core and shell dimension can be 10 nm or less.

Semiconductor materials and dopants are also described in U.S. Patent Application Publication No. 2013/0140506, filed May 14, 2012, the entirety of which is incorporated herein by reference.

Optical Characteristics and Advantages

Figure 5:
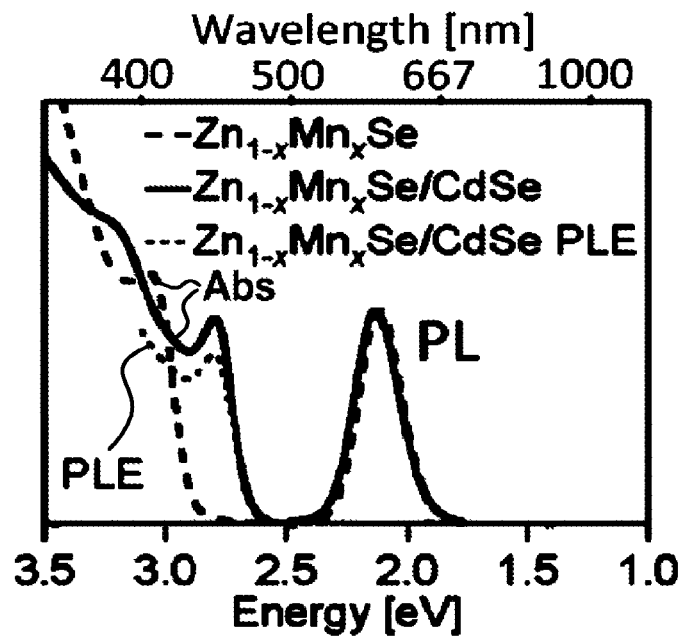
FIG. 5 shows absorption spectra of embodiments of photoluminescent nanoparticles. The photoluminescence maximum at 2.1 eV corresponds to ~590 nm.
Figure 6:
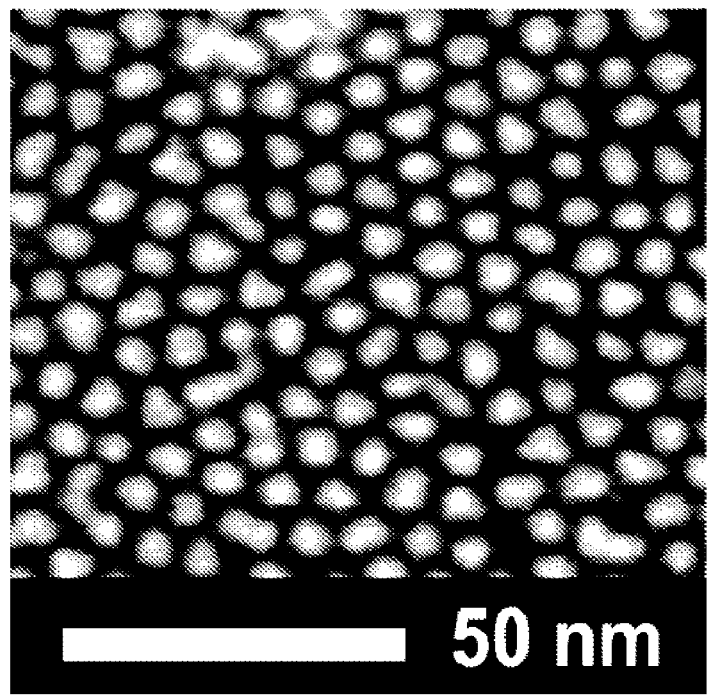
FIG. 6 is a scanning electron micrograph of an embodiment of photoluminescent nanocrystals.

Without wishing to be bound by theory, it is believed that a semiconductor nanocrystal's bandgap can be tuned by varying the size of the nanocrystal, and/or by replacing certain elements of a semiconductor nanocrystal by alloying and/or or making a core-shell structure. For example, a Mn:ZnSe photoluminescent nanoparticle can have an emissive excited state produced by energy transfer from the ZnSe nanocrystal whose bandgap is size dependent. Other semiconductors materials can have different bandgaps. For example, by replacing some or all of the Zn with Cd in ZnSe nanocrystals by alloying (forming $Zn_{1-x}Cd_xSe$ nanocrystals) or core/shell growth, the energy gap of the nanocrystal can be narrowed to absorb substantially more of the solar spectrum (FIG. 5), while still allowing essentially zero overlap between the semiconductor nanocrystal host absorption and $Mn^{2+}$ luminescence. In some embodiments, the photoluminescent nanoparticles can remain small relative to the wavelength of light (FIG. 6), can be solution-processable, and can be compatible with polymer or glass matrix formation.

In certain embodiments, there is little or no overlap between the emission and absorption spectra of a given photoluminescent nanoparticle. For example, the emission spectrum and lowest absorption band of a given photoluminescent nanoparticle do not overlap by greater than 25% (e.g., greater than 20%, greater than 15%, greater than 10%, greater than 5%, greater than 2%) of their integrated normalized areas. In other embodiments, the absorption wavelength range and the emission wavelength range of the photoluminescent nanoparticle do not overlap at any wavelength where the absorption extinction coefficient exceeds $1000$ $M^{-1}cm^{-1}$ (in nanocrystal molarity).

In some embodiments, the absorption coefficient of a photoluminescent nanoparticle at an energy equal to the nanoparticle bandgap energy exceeds the absorption coefficient at an energy equal to the maximal emission by a factor of at least 500 (e.g., at least 750, at least 1000, at least 1500, or at least 2000), such that the photoluminescent nanoparticle is a good absorber for incident photons but does not have significant absorbance at the emission wavelengths.

The photoluminescent nanoparticles can reduce photon losses from self-absorption and scattering compared to other LSC luminophores, including other types of photoluminescent nanoparticles. As will be discussed in Example 2, infra, when compared to known core-shell photoluminescent nanoparticles, the photoluminescent nanoparticles of the present disclosure demonstrate smaller waveguide losses.

A material (e.g., an LSC) that includes the photoluminescent nanoparticle can have an optical transmittance of 90% or more (95% or more, or 97% or more) below the nanoparticle bandgap energy. Depending on an application for the photoluminescent nanoparticles, different combinations of transparency ranges and emission ranges can apply. For example, if the photoluminescent nanoparticles are to be used in a fully transparent window, the material that includes the nanoparticles can have a 90% or greater optical transmittance between 400 nm and 800 nm. If the photoluminescent nanoparticles are to be used in a partially transparent window, the material that includes the nanoparticles can have a 10% or greater (e.g., 25% or greater, 50% or greater, or 75% or greater) optical transmittance between 400 nm and 800 nm. If the photoluminescent nanoparticles are to be used for non-window applications, the material that includes the nanoparticles can exhibit less than 10% optical transmittance at energies higher than the bandgap.

In some embodiments, the material that includes the photoluminescent nanoparticles has an optical transmittance of 10% or less at energies greater than the nanoparticle bandgap energy. Such a material can be used for applications where it is more preferable to maximally absorb solar irradiance than to provide partial transparency at energies greater than the bandgap. For example, an LSC applied to a rooftop can provide greater benefit from maximally absorbing solar irradiance than by providing partial transparency. In another example, an LSC having transmittance of 10% or less at energies greater than the nanoparticle bandgap energy can be used to filter UV solar photons, and/or to harvest the maximum amount of solar energy.

The photoluminescent nanoparticles can have a QY of greater than 50% (e.g., greater than 75%, or equal to 100%).

The photoluminescent nanoparticles of the present disclosure are well-suited for incorporation into a waveguide matrix for LSC applications. For example, the photoluminescent nanoparticles luminesce with high QYs and little to no self-absorption, which allows very large high-efficiency LSCs to be made. This can be important to reducing the cost of solar electricity generated using an LSC.

Figure 7:
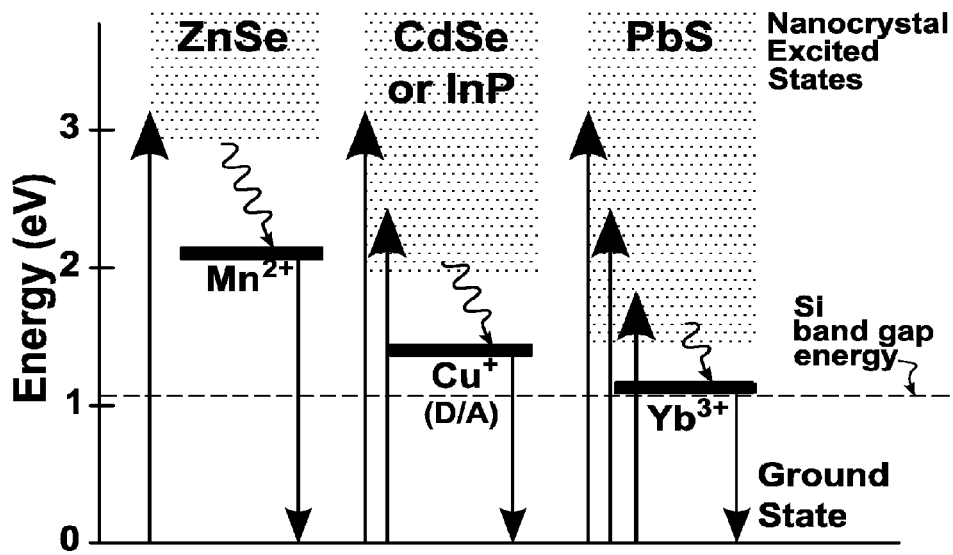
FIG. 7 is an energy diagram of embodiments of defect and semiconductor material combinations for photoluminescent nanoparticles.

Another advantage of the photoluminescent nanoparticles of the present disclosure is that the range of wavelengths (color) of light absorbed by the photoluminescent nanoparticles can be tuned from the ultraviolet to the near-infrared by controlling their size, structure, and chemical composition. This enables favorable matching to the solar spectrum, thereby increasing or optimizing the fraction of sunlight that can be harvested. As an example, an LSC incorporating the photoluminescent nanoparticles that selectively absorb only UV or infrared light would be optically transparent, but could still be used to generate electricity. As another example, using two or more different types of photoluminescent nanoparticles in a single LSC, it is possible to make a device that achieves color-balanced absorption, such that the device can have any desired color, including uniform grey. Hence, LSCs based on photoluminescent nanoparticles would be suitable for use as a window coating or a versatile architectural material for building exteriors, roofing, etc. The minimal absorption and maximal emission energies of several representative examples of the photoluminescent nanoparticles of the present disclosure are shown in FIG. 7, which demonstrates that a wide range of absorption and emission energies can be obtained. Referring to FIG. 7, $Cu^+$-doped CdSe or InP nanocrystals show donor/acceptor recombination luminescence that is red-shifted from the semiconductor absorption edge. $Yb^{3+}$-doped PbS shows sharp sensitized $Yb^{3+}$ f-f luminescence. These and related doped nanocrystals can improve LSC performance by harvesting a broader portion of the solar spectrum and providing better luminescence matching with Si photovoltaics, while retaining the small reabsorption losses displayed by $Mn^{2+}$-doped ZnSe nanocrystals.

In some embodiments, several LSC layers, each containing a different photoluminescent nanoparticle and interfaced to a photovoltaic cell (PV) with a bandgap matched to the nanoparticle's emission can be stacked to increase the overall solar energy conversion efficiency, analogously to a multi junction PV.

Yet another advantage of the photoluminescent nanoparticles is that the nanoparticles are more photochemically stable than most organic luminophores. This is important for producing a device that can function outdoors for many years, as required for most applications.

Yet a further advantage of the photoluminescent nanoparticles is that the nanoparticles can be processable in a number of solvents and by a number of methods, allowing facile integration into plastic or glass waveguide matrices at high photoluminescent nanoparticle concentration, and allowing co-deposition with the matrix material by scalable solution-based methods including spray coating, ultrasonic spray coating, spin coating, dip coating, infusion, roll-to-roll processing, and ink jet printing.

Incorporation of Photoluminescent Nanoparticles into Waveguide Materials

The photoluminescent nanoparticles can be incorporated into waveguide materials for LSC applications. For example, the LSC can include a photoluminescent nanoparticle to nanocrystal to waveguide material weight ratio of less than 10% (e.g., less than 8%, less than 6%, less than 4%, less than 2%, or less than 1%) and/or more than 0.01% (more than 1%, more than 4%, more than 6%, or more than 8%).

The waveguide matrix can be a polyacrylate, a polycarbonate, a cyclic perfluorinated polyether, a polysilicone, a polysiloxane, a polyalkylacrylate, a cyclic olefin (e.g., Zeonex COP™ (Nippon Zeon) and Topas COC™ (Celanese AG)), crosslinked derivatives thereof, and/or copolymers thereof, wherein each of which is independently optionally substituted with a $C_{1-18}$ alkyl, $C_{1-18}$ alkenyl, aryl group, and any combination thereof. In some embodiments, the waveguide material is poly(methyl methacrylate) or poly(lauryl methacrylate), and cross-linked derivatives thereof. In some embodiments, the waveguide material is poly(lauryl methacrylate-co-ethylene glycol dimethacrylate). The waveguide matrix can be transparent.

In some embodiments, the waveguide material can be an inorganic glass, a polycrystalline solid, or an amorphous solid. Representative examples of inorganic glass, polycrystalline solid, or amorphous solid include indium tin oxide, $SiO_2$, $ZrO_2$, $HfO_2$, ZnO, $TiO_2$, fluorosilicates, borosilicates, phosphosilicates, fluorozirconates (e.g., ZBLAN ($ZrF_4$—$BaF_2$—$LaF_3$—$AlF_3$—NaF)), organically modified silicates (e.g., silica-polyethylene urethane composites, silica-polymethylmethacrylate composites, and glymo-3-glycidoxypropyltrimethoxysilane). For example, the waveguide material can be an inorganic glass, such as indium tin oxide.

The waveguide material can have a surface roughness of 2 nm or less (e.g., 1 nm or less, 0.5 nm or less, or 0.2 nm or less). Without wishing to be bound by theory, it is believed that a waveguide material having a smooth surface can minimize light scattering events.

When the photoluminescent nanoparticles are incorporated into a waveguide material, the resulting LSC can have an OQE of up to about 75% at geometric gains exceeding 20. For example, the OQE of the LSC can be greater than 25% (e.g., greater than 50%, greater than 70%).

Figure 8:
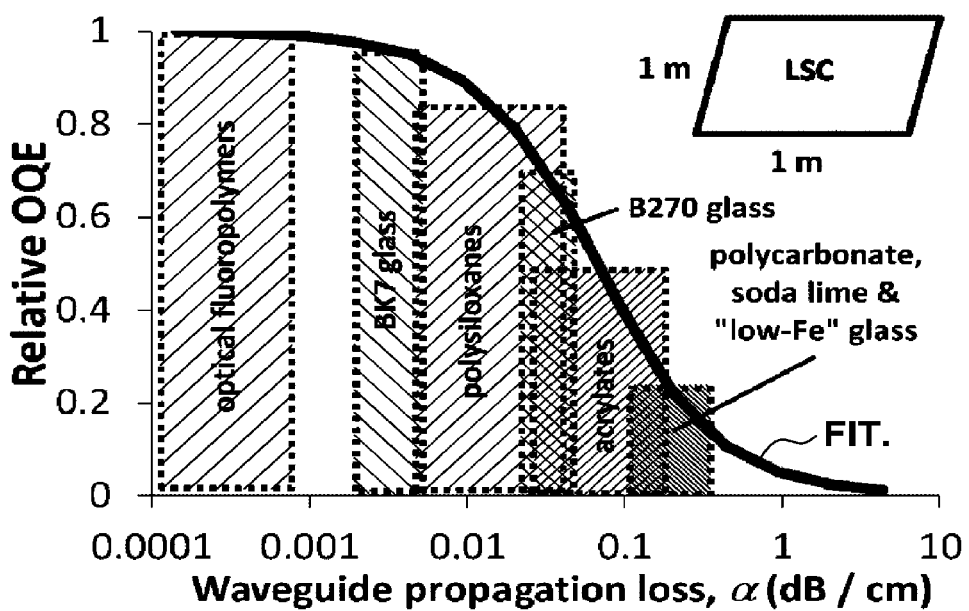
FIG. 8 is a graph showing the effect of waveguide losses on the OQE of a 1 m$^2$ LSC and the attenuation coefficients for waveguide materials.

The effects of optical losses in an LSC resulting from absorption by the waveguide material, scattering from waveguide imperfections, roughness at the surface of the waveguide, and similar non-idealities can be summarized through a waveguide attenuation coefficient, $\alpha$. Different waveguide materials can possess different attenuation coefficients, and to maximize OQE, $\alpha$ should be as small as possible. Referring to FIG. 8, the relative OQE of a square LSC measuring 1 m on each side is shown on the y-axis for a representative group of waveguide materials, and the x-axis shows ranges of $\alpha$ that are generally applicable for each material. In some embodiments, the LSC having a plurality of photoluminescent nanoparticles can have an attenuation coefficient of less than 0.05 dB/cm (less than 0.03 dB/cm, less than 0.01 dB/cm) at a wavelength corresponding to a peak emission of the plurality of photoluminescent nanoparticles.

In some embodiments, in addition to minimizing waveguide losses due to absorption by the waveguide material, scattering from waveguide imperfections, roughness at the surface of the waveguide, and similar non-idealities, there may be other considerations in selecting a waveguide material, such as cost or environmental lifetime. The compatibility of the photoluminescent nanoparticles with a wide range of waveguide materials as described above can enable selection of a waveguide material that is well-suited for a particular LSC application of the LSC. As an example, referring again to FIG. 8, a large LSC can benefit from a more highly transparent waveguide material such as a polysiloxane, whereas a less transparent (but also less expensive) waveguide material such as poly(methyl methacrylate) can be used for a small LSC.

Architecture of LSCS

The LSC can be a single layer or a multilayer device. Configurations of waveguide materials in an LSC are described, for example, in U.S. Patent Application Publication No. 2011/0253198, filed Mar. 4, 2011, incorporated herein by reference in its entirety.

Figure 9:
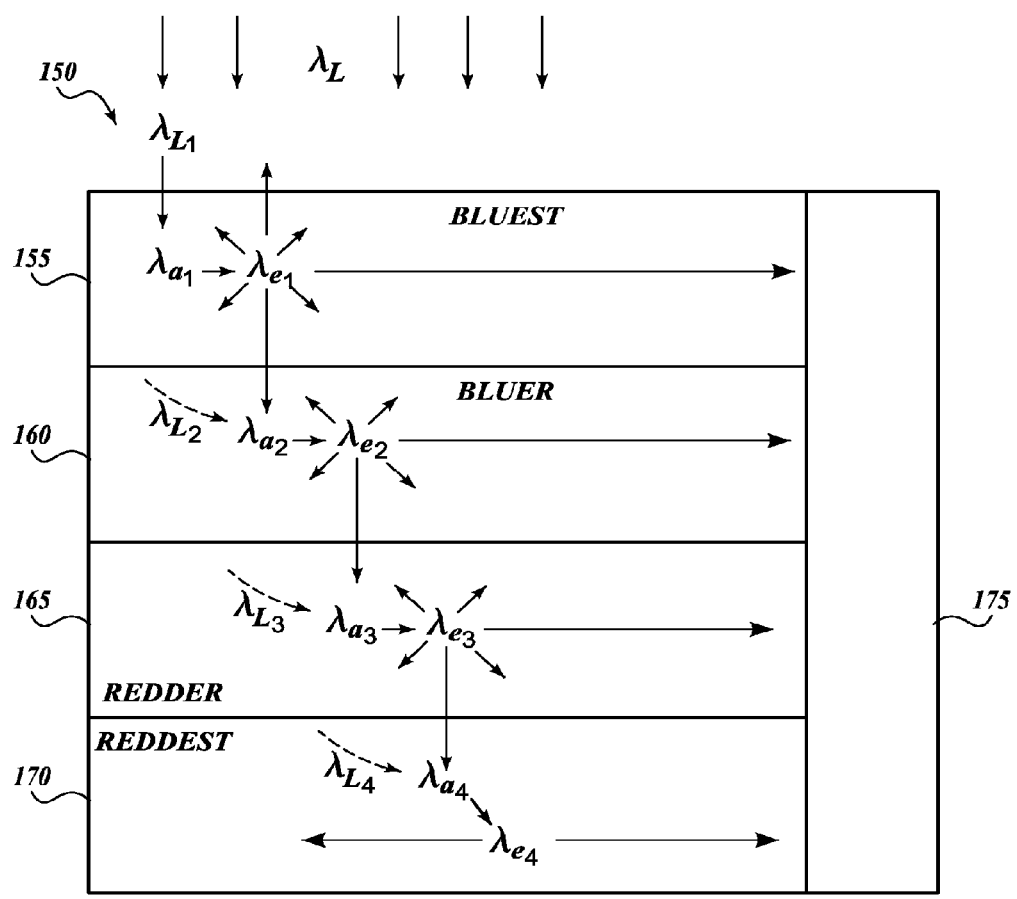
FIG. 9 is a schematic illustration of an embodiment of a multilayered LSC.

Referring now to FIG. 9, a multilayer LSC device 150 is illustrated wherein a number of waveguide layers 155, 160, 165, and 170 are arranged in a stack. Light of broad spectrum wavelengths $\lambda_L$ is impinged on the device, and the luminophore layers 155, 160, 165, and 170 absorb and luminesce to direct light into the PV 175 to produce electrical current. The impinging light $\lambda_L$ in the illustrated embodiment has at least light of wavelength $\lambda_{L1}$, but may be a broader light source (e.g., white light source) containing any number of wavelengths of light. However, for simplicity, the device 150 illustrated in FIG. 9 primarily describes the device with regard to input of light of wavelength $\lambda_{L1}$.

The layer 155, 160, 165, and 170 of the device 150 are arranged from "bluest" (155) to "reddest" (170), although it will be appreciated these terms are not indicative of the actual color of absorption or emission of the layer, but only indicating that the "bluest" is the shortest wavelength of light (e.g., emitted light), and the "reddest" is the light having the longest emission wavelength. Layers 155, 160, 165, and 170 each include one or more luminophores of any type, provided that at least one of layers 155, 160, 165, and 170 includes a photoluminescent nanoparticle.

The layers of the device 150 in FIG. 9 begin at the layer closest to the source of light, which is layer 155, the bluest layer. The luminophores (e.g., the photoluminescent nanoparticles) in layer 155 have an absorption at wavelength $\lambda_{a1}$ and a luminescent emission at wavelength $\lambda_{e1}$.

Layer 160 of the device 150 is "bluer" in relation to layers 165 and 170. The luminophores (e.g., the photoluminescent nanoparticles) of the layer 160 have an absorption at wavelength $\lambda_{a2}$ and a luminescent emission at $\lambda_{e2}$.

Layer 165 of the device 150 is a layer wherein the luminophores are "redder" than the blue layers 155 and 160. The luminophores (e.g., the photoluminescent nanoparticles) of layer 165 have an absorption at $\lambda_{a3}$ and a luminescent emission at $\lambda_{e3}$.

Layer 170 of the device 150 includes luminophores (e.g., the photoluminescent nanoparticles) having the reddest emission of any of the layers of any of the device 150.

The device 150 harvests the energy of the incoming light $\lambda_L$ according to at least the following exemplary description of operation. Initially, light of wavelength $\lambda_{L1}$ impinges on the bluest isotropic layer 155. The absorption $\lambda_{a1}$ of the bluest layer 155 overlaps with the wavelength of the incident light $\lambda_{L1}$, thus causing the luminophore to luminesce and emit light of wavelength $\lambda_{e1}$. The light at $\lambda_{e1}$ is emitted in all directions, including some light that reaches the PV 175, some light that will emit back toward the light source, and some light that will emit in the direction of the bluer layer 160.

Light of wavelength $\lambda_{e1}$ that crosses from the bluest layer 155 to the bluer layer 160 impinges on the luminophores in the bluer layer 160. The absorption wavelength $\lambda_{a2}$ of the luminophores of the bluer layer 160 overlap $\lambda_{e1}$, causing luminescence at $\lambda_{e2}$, once again in all directions.

Light of wavelength $\lambda_{e2}$ that crosses from the bluer layer 160 into the redder layer 165 is absorbed at wavelength $\lambda_{a3}$, which overlaps with $\lambda_{e2}$. The luminophores in the redder layer 165 luminesce at wavelength $\lambda_{e3}$ in all directions.

Light emitted from the redder layer 165 at wavelength $\lambda_{e3}$ that crosses into the reddest layer 170 will be absorbed by the luminophores in layer 170 at wavelength $\lambda_{a4}$, which overlaps $\lambda_{e3}$. The luminophores then luminesce at wavelength $\lambda_{e4}$.

In some embodiments, the luminophores in the reddest layer 170 are oriented according to their emission and absorption dipoles, as described in U.S. Patent Application Publication No. 2011/0253198, filed Mar. 4, 2011, herein incorporated by reference in its entirety. In such an embodiment, the light at wavelength $\lambda_{e4}$ is preferentially emitted in the plane of the layer, and therefore travels either toward or away from the PV 175. Notably, light emitted at wavelength $\lambda_{e4}$ does not emit in a direction either toward layer 165 or away from the device (toward the "bottom" of the device illustrated in FIG. 9). Accordingly, the oriented reddest layer 170 can acts as a barrier for containing light within the device 150 at the bottom edge.

If the source of light $\lambda_L$ is a broader wavelength source (e.g., white light), it will be appreciated that the luminophores in layers 160, 165, and 170 need not only harvest light directly from the layers preceding them in the energy cascade, but can also absorb and luminesce based on light directly impinging on the luminophores at the absorption wavelength. This effect is illustrated in FIG. 9 with the dashed arrows in layers 160, 165, and 170, wherein light of wavelength $\lambda_{L2}$ can optionally impinge on the luminophores in the bluer layer 160; light of wavelength $\lambda_{L3}$ can optionally impinge on the redder luminophores in layer 165, and light of wavelength $\lambda_{L4}$ can impinge on the reddest luminophores in reddest layer 170.

In some embodiments, instead of having a waveguide layer including a luminophore in layer 170, layer 170 can instead be a cladding layer having a refractive index that is less than a refractive index of layer 160. Thus, the LSC can have one or more cladding layers in optical communication with an outer layer of waveguide materials of the LSC. The cladding layer can have a refractive index less than a refractive index of the waveguide materials, such that the cladding layer causes light to be confined within the waveguide materials by total internal reflection.

In some embodiments, instead of having a single PV abutting waveguide layers 155, 160, 165, and 170, one or more of layers 155, 160, 165, and 170 can each be in optical communication with a separate PV, which can have a bandgap that matches the peak emission of the layer it is coupled to.

While FIG. 9 describes LSC devices having multiple layers of luminophores wherein each layer includes a single luminophore, it will be appreciated that a single waveguide layer can include multiple luminophores.

Figure 10:
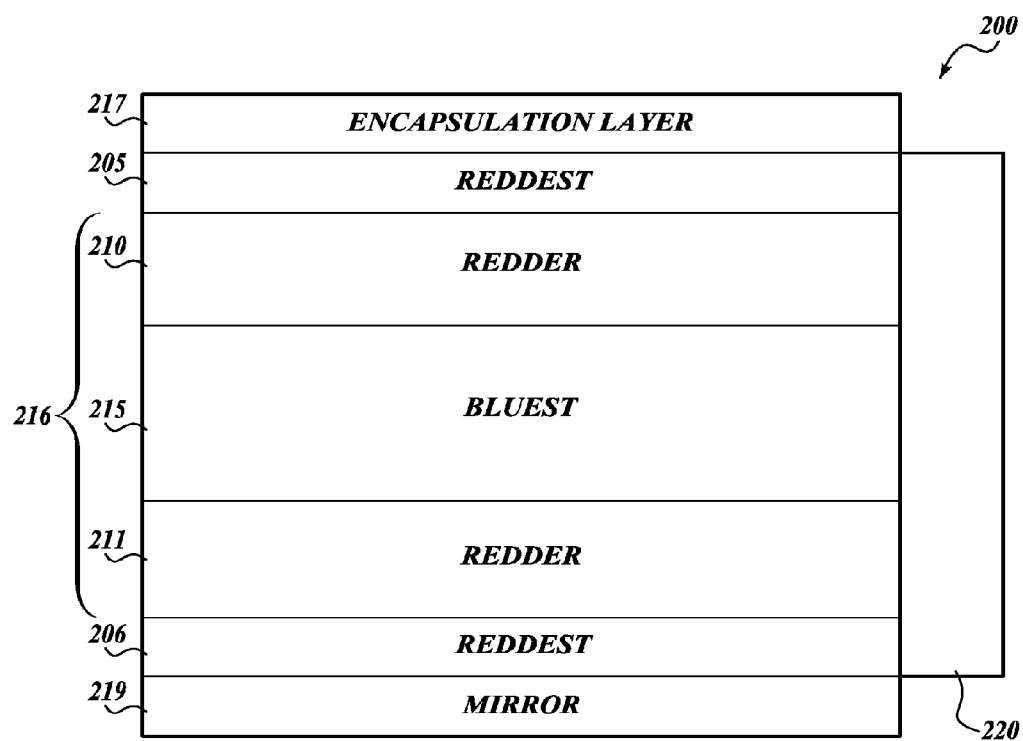
FIG. 10 is a schematic illustration of an embodiment of a multilayered LSC.

Referring now to FIG. 10, a "packaged" LSC device 200 is illustrated wherein a number of isotropic layers 210, 211, and 215 form a core 216 including luminescent layers. The core 216 is bounded on the upper and lower ends by reddest layers 205 and 206. The bottom layer of the device is a mirror 219 configured to reflect at least the reddest wavelength. In a preferred embodiment, the mirror 219 reflects all wavelengths that may potentially impinge on the mirror 219.

In an alternative embodiment, mirror 219 can be either a mirror or a scattering surface.

In an exemplary device design, the mirror 219 is preferably separated from layer 206 by either an air gap or a low-index layer (not illustrated). Direct contact with layer 206 would likely diminish the total internal reflection efficiency of the waveguiding in layer 206.

The top layer of the device is an encapsulation layer 217, which can serve to protect the device 200 from environmental conditions, such as moisture, oxygen, and other damaging effects. The encapsulation layer 217 may also be an anti-reflection layer that is configured to allow maximum light impinging on the device 200 into the luminophores contained within. The luminophore-containing layers 205, 206, and 216 all abut a PV 220 for converting light emitted into electrical current.

In the device 200 illustrated in FIG. 10, the bluest layer 215 is in the middle of the device, followed by, moving outward, redder layers 210 and 211, and finally, bounded by reddest layers 205 and 206. It will be appreciated that the similarly named, but differently numbered components of the device 200 can be either the same or different. That is, the redder layers 210 and 211 can be the same or different, as can the reddest layers 205 and 206, etc.

As discussed above with regard to FIG. 9, when the reddest layer 170 includes an oriented luminophore, layer 170 in the device 150 can act to create a boundary for the light contained within the device 150 so as to maximize containment of the energy harvested by the device 150 and turned into electrical current by the PV 175. In some embodiments, this concept is extended in the device 200 illustrated in FIG. 10, wherein reddest layers 205 and 206 bound both the top and bottom of the device 200 can include oriented luminophores, so as to create confinement at both upper and lower surfaces of the device 200, thereby maximizing the amount of light energy retained within the device.

In certain embodiments, the luminophore layer with the longest emission wavelength (e.g., the "reddest") includes oriented luminophores.

In some embodiments, instead of having a single PV abutting waveguide layers 205, 206, 210, 211, and 215, one or more of layers 205, 206, 210, 211, and 215 can each be in optical communication with a separate PV, which can have a bandgap that matches the peak emission of the layer it is coupled to.

In some embodiments, instead of encapsulation layer 217 and mirror 219, one or both of layers 217 and 219 can instead be a cladding layer having a refractive index that is less than a refractive index of an adjacent layer (i.e., layer 205 and/or 206).

Fabrication of multilayer LSCs is accomplished using methods known to those of skill in the art and disclosed herein. For example, layers including photoluminescent nanoparticles can be fabricated using known methods (e.g., spin coating, drop coating, evaporation, vapor deposition, and the like). Layers including oriented luminophore layers can be fabricated using liquid crystals, extrusion, or other methods disclosed in U.S. Patent Application Publication No. 2011/0253198, filed Mar. 4, 2011, herein incorporated by reference in its entirety.

A substrate may be used to support a layer (or layers) that are not self-supporting. A multilayer LSC can also or alternatively be fabricated in two or more portions and joined (e.g., bonded) to form a finished device. The "stack" of luminophore-containing waveguides is edge-coupled to a PV cell to form a completed multilayer LSC system for producing electricity.

While PVs are described above, it is understood that the LSC can additionally or alternatively be in optical communication with one or more other light-utilization devices such as a solar heater, a concentrated solar thermal power system, a lighting device, and/or a photochemical reactor.

Uses of the LSCs

Without wishing to be bound by theory, it is believed that theoretical concentration factors exceeding 100× are possible for an LSC of the present disclosure because the maximum optical gain is limited by the photoluminescent nanoparticle's Stokes shift, rather than optical focusing.

The LSC can be made in a variety of colors, and can even be optically transparent, rendering the LSC useful as solar windows or other building-integrated architectural elements. The LSC can be configured for a variety of potential applications ranging from consumer electronics to utility-scale solar farm deployment. Because the materials and installation costs of an LSC are lower than those for conventional photovoltaic panels, solar electricity generated using an LSC has the potential to be significantly cheaper than other forms of solar power.

As an example, the LSC can be used for window applications. As discussed above, the optical transmittance of a photoluminescent nanoparticle (and of the resulting LCS) can be tuned depending on the application. The LSC including photoluminescent nanoparticles can have a peak emission at wavelengths longer than 850 nm, so as to decrease visible "glow." In some embodiments, for window and other applications, visible glow is alternatively or additionally be reduced (or eliminated) by incorporating into a cladding layer an absorbing non-emissive species such as an organic dye, whose absorption range can overlap with the emission range of the photoluminescent nanocrystals. The dye-containing cladding layer can be separated from the waveguide layer by a low refractive index layer, thereby absorbing light leaving the waveguide layer out of its escape cone.

In some embodiments, for optimal interfacing of the LSC to silicon photovoltaics, a maximal emission wavelength is between 900-1100 nm. In general, optimal interfacing to a photovoltaic device is achieved when the emission maximum of the photoluminescent nanocrystal is slightly lower in energy than the bandgap of the photovoltaic.

In some embodiments, the LSC form or is part of a coating for a device.

In some embodiments, the LCS form or is part of a free-standing polymer film.

In some embodiments, the LCS form part of an electronic display or a touch screen.

The following examples are included for the purpose of illustrating, not limiting, the described embodiments.

EXAMPLES

Example 1. Preparation and Characterization of Representative Photoluminescent Nanoparticles In this example, the preparation, characterization, and use of representative photoluminescent nanoparticles of the disclosure are described.

Fabrication and Characterization of Photoluminescent Nanoparticle-Containing LSCs LSCs were prepared and characterized based on several representative examples of photoluminescent nanoparticles with different structures and compositions. Mn:ZnSe/ZnS core-shell photoluminescent nanoparticles were grown by thermal decomposition of the tetramer $(Me_4N)_2[Zn_4(SePh)_{10}]$ in hexadecylamine at 270° C. under a pressure of $N_2$ gas for 30 to 60 minutes while also in the presence of $MnCl_2$. The resulting nanocrystals were then coated with a ZnS shell by successive slow additions of zinc oleate and trioctylphosphine sulfide in a solution of octadecene and oleylamine at 230° C. under a pressure of $N_2$ gas for 5 to 25 minutes. Particles were suspended in toluene and repeatedly washed using ethanol and methanol.

Mn:ZnSe/ZnS/CdS/ZnS multishell photoluminescent nanoparticles were prepared in a similar way except after the addition of the first ZnS shell there were successive additions of a CdS and ZnS shells. These shells were deposited by successive slow additions of cadmium oleate and trioctylphosphine sulfide or zinc oleate and trioctylphosphine sulfide. Particles were suspended in toluene and repeatedly washed using ethanol and methanol. $Zn_{1-x-y}Cd_xMn_ySe$ (x and y have values such that $1-x-y>x+y$ and $x>y$. Here, x is approximately 0.1 and y is approximately 0.01) photoluminescent nanoparticles were grown by thermal decomposition of the tetramer $(Me_4N)_2[Zn_4(SePh)_{10}]$ in hexadecylamine at 270° C. under a pressure of $N_2$ gas for 30 to 60 minutes while also in the presence of both $CdCl_2$ and $MnCl_2$. Particles were suspended in toluene and repeatedly washed using ethanol and methanol.

Cu-doped CdSe photoluminescent nanoparticles were prepared by dissolving cadmium acetate and oleic acid in hexadecane and degassing under $N_2$. To this mixture, copper stearate was added against positive nitrogen pressure and the solution was degassed again. After heating to 180° C., selenium powder in TOP was rapidly injected into the cadmium solution, the nanoparticles were allowed to grow, and the reaction was then cooled. The nanoparticles were purified by washing with ethanol:acetone, centrifugation, and redispersion in toluene. In another synthesis, $SeO_2$, cadmium myristate, and CuCl in were added to octadecene, degassed, and heated to 250° C., where oleic acid was added dropwise and the reaction was cooled following nanoparticle formation. The nanoparticles were purified by washing with ethanol:acetone, centrifugation, and redispersion in toluene Using these photoluminescent nanoparticles two groups of LSC devices were prepared, one based on photoluminescent nanoparticle-containing polymer films, the other employing photoluminescent nanoparticle-containing liquid filled planar cells. Results from these devices will now be described.

Polymer Film LSCs

Polymer devices were prepared by dispersing a toluene solution of photoluminescent nanoparticles into laurylmethacrylate containing ~1 wt % of Irgacure 651 photoinitiator.

Several droplets of the resulting mixture were placed on a clean borosilicate glass coverslip, which was then covered by a second coverslip and the resulting glass/solution/glass samples were photopolymerized to form a solid film. Samples measured 2.5×7.5×0.16 cm in size, resulting in a geometric gain, defined as the facial-to-edge area ratio, G=20 when the entire LSC is illuminated. LSCs were uniformly illuminated with 400 nm monochromatic light and emission from an aperture of length l=0.7 cm centered in one edge was collected by an integrating sphere, passed through a monochrometer, and detected by a photomultiplier tube. The remaining device edges were blackened.

The optical quantum efficiency (OQE), defined as the fraction of absorbed photons reaching a device edge, was determined. To compute it, two corrections to the measured edge emission intensity were required to account for: (1) collection of light from only a portion of the whole perimeter, and (2) detection of only a certain fraction of photons reaching the device edge using the experimental arrangement (some photons travel in directions lying outside the edge escape cone and hence upon reaching an edge are reflected back into the waveguide). In actual application, the LSC would usually have one or more perimeter-mounted PVs whose refractive index exceeded that of the LSC matrix (e.g. Si or GaInP); under such conditions all photons reaching the edge could in principle be captured. Applying these corrections the efficiency was computed using the procedure described in Erickson, C. S. et al., Zero-Reabsorption Doped-Nanocrystal Luminescent Solar Concentrators, *ACS Nano* 2014, 8, 3461, incorporated herein in its entirety.

Figure 11:
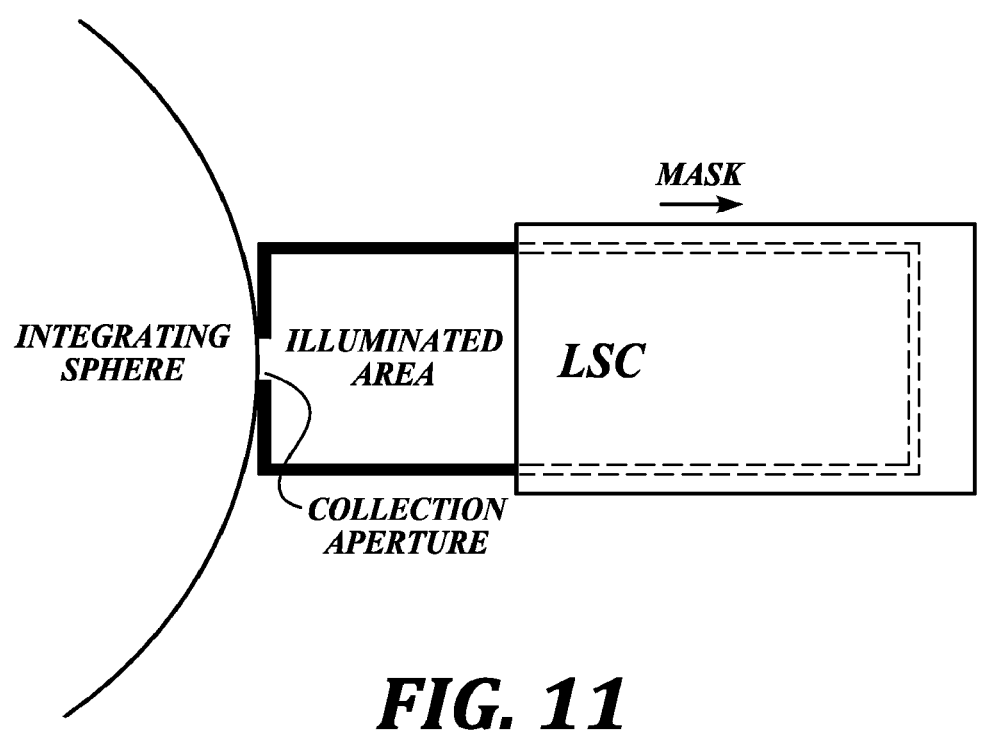
FIG. 11 is a schematic representation of an experimental setup for measuring LSC OQE as a function of geometric gain.

In some measurements, successively larger areas of the device were illuminated using a movable mask, enabling determination of OQE as a function of geometric gain. FIG. 11 shows the experimental arrangement used to perform these measurements.

Figure 12A:
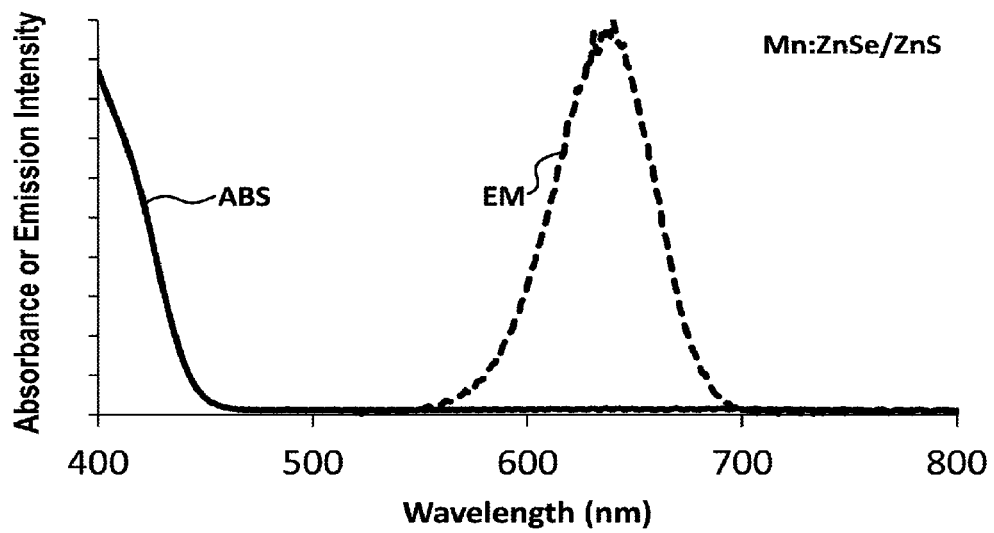
FIGS. 12A-12C are normalized absorption (ABS) and emission (EM) spectra of polymer film LSCs including embodiments of photoluminescent nanoparticles.
Figure 12B:
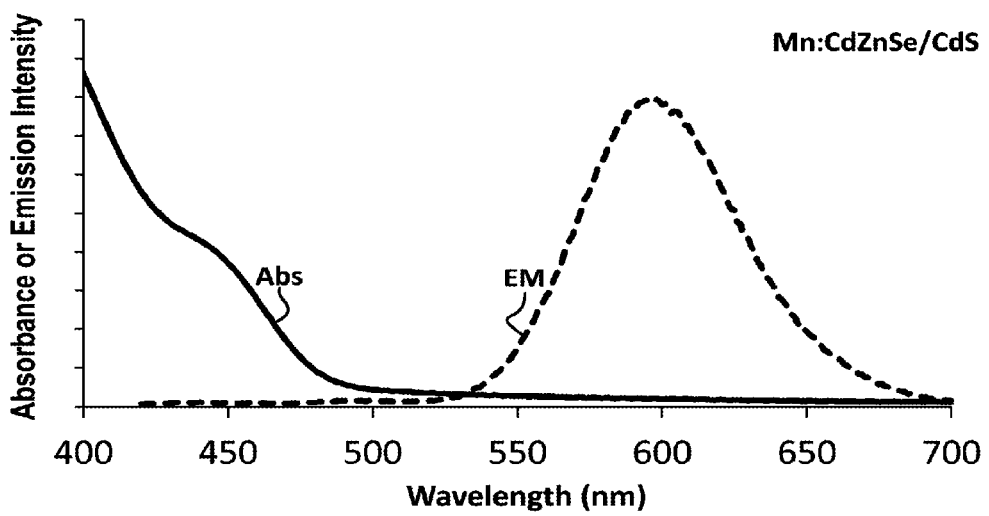
Figure 12C:
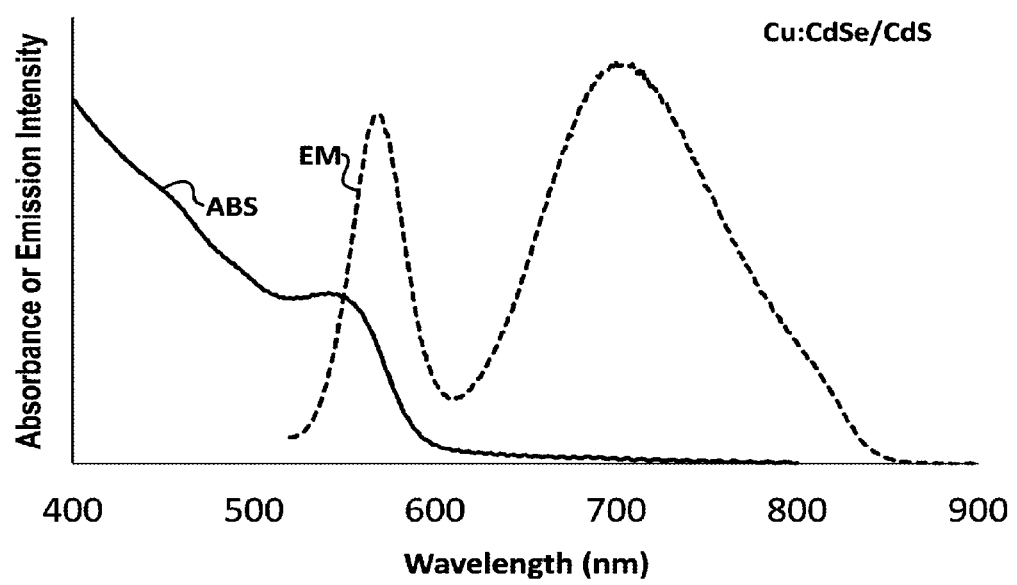

Representative absorption and emission spectra from three polymer film devices prepared from three types of photoluminescent nanoparticles are shown in FIGS. 12A-12C. In each case absorption was dominated by the semiconductor nanocrystal (the sensitizer) and emission was dominated by the dopant (the activator, either $Mn^{2+}$ or $Cu^{+}$). In one case (Cu:CdSe/CdS, FIG. 12C) some excitonic emission can be observed. This results in some overlap with the absorption spectrum, producing some self-absorption in this case. In the other two cases (i.e., Mn:ZnSe/ZnS and Mn:CdZnSe/CdS, FIGS. 12A and 12B, respectively) shown there is essentially zero reabsorption. The optical quantum efficiencies for these devices are listed in Table 1. Some other similarly prepared devices (data not shown) exhibited optical quantum efficiencies up to 68% at a geometric gain of 10, among the highest ever reported, and close to the theoretical maximum of ~75%, corresponding to a hypothetical device with directionally isotropic luminophore emission, unity photoluminescence QY, and no self-absorption. This exceptionally high level of performance could be attributed to the high QY of the incorporated photoluminescent nanoparticles used to prepare it, which was measured to be 97%. This illustrated the importance of QY on LSC performance, which should be as high as possible. Devices prepared from photoluminescent nanoparticles having lower QY (for example, a liquid-filled LSC device based on Mn:ZnSe/ZnS, which had a measured QY of the incorporated photoluminescent nanoparticles of 50%) performed less efficiently than comparable devices based on photoluminescent nanoparticles having higher QY.

TABLE 1

| LSC based on | Device configuration | OQE at G = 20 | Attenuation coefficient (dB/cm) |
|---|---|---|---|
| Mn: ZnSe/ZnS | Polymer film | 54% | 0.009 |
| Mn: CdZnSe/ZnS | Polymer film | 35% | 0.004 |
| Cu: CdSe/CdS | Polymer film | 4.1% | 0.39 |

Figure 13A:
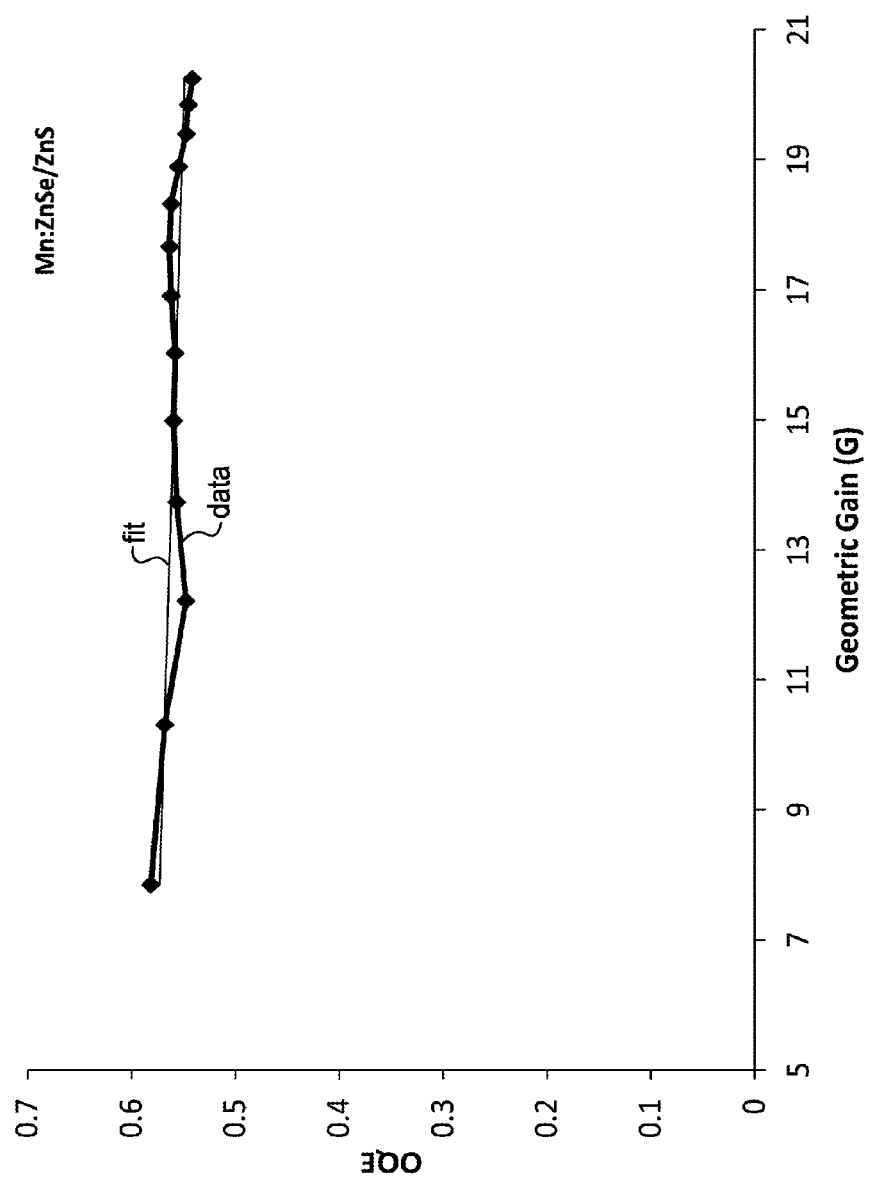
FIG. 13A-13C are graphs showing OQE variation with geometric gain for embodiments of photoluminescent nanoparticles.
Figure 13B:
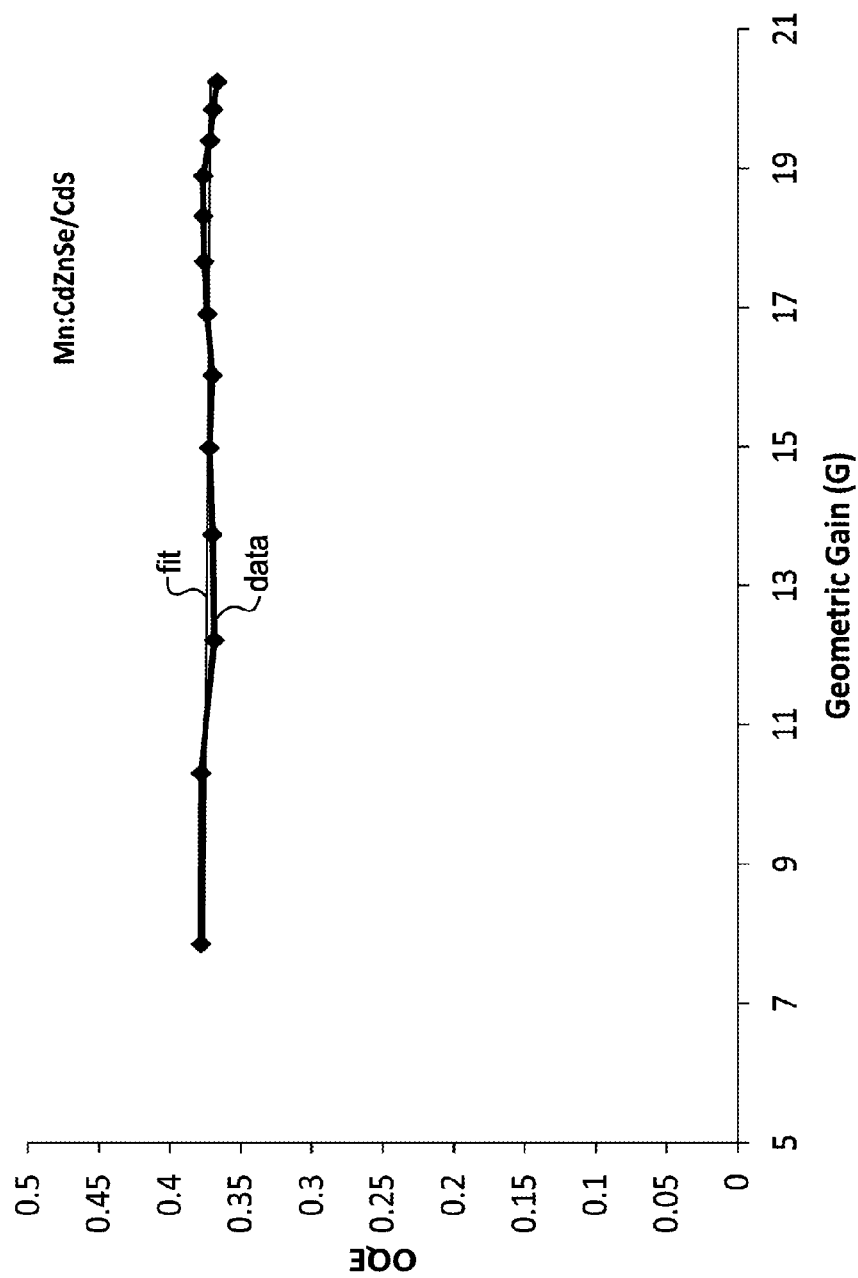
Figure 13C:
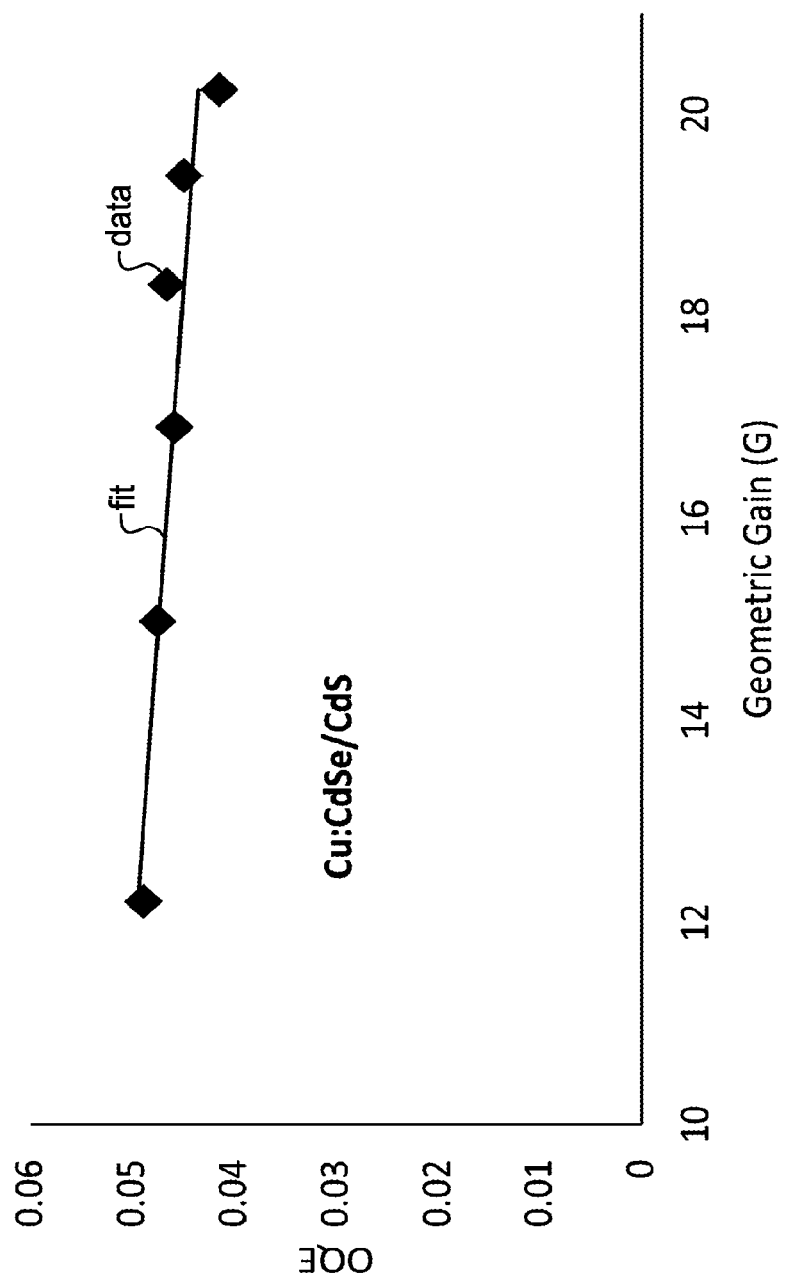

FIGS. 13A-13C show the OQE variation with geometric gain for these devices. Referring to FIGS. 13A-13C, OQE is observed to gradually decrease as the geometric gain is increased. From the rate of decrease the attenuation coefficient, α, was computed following a procedure described in Erickson C. S. et al., Zero-Reabsorption Doped-Nanocrystal Luminescent Solar Concentrators", *ACS Nano* 2014, 8, 3461., incorporated herein in its entirety, with the results summarized in Table 1.

Figure 14A:
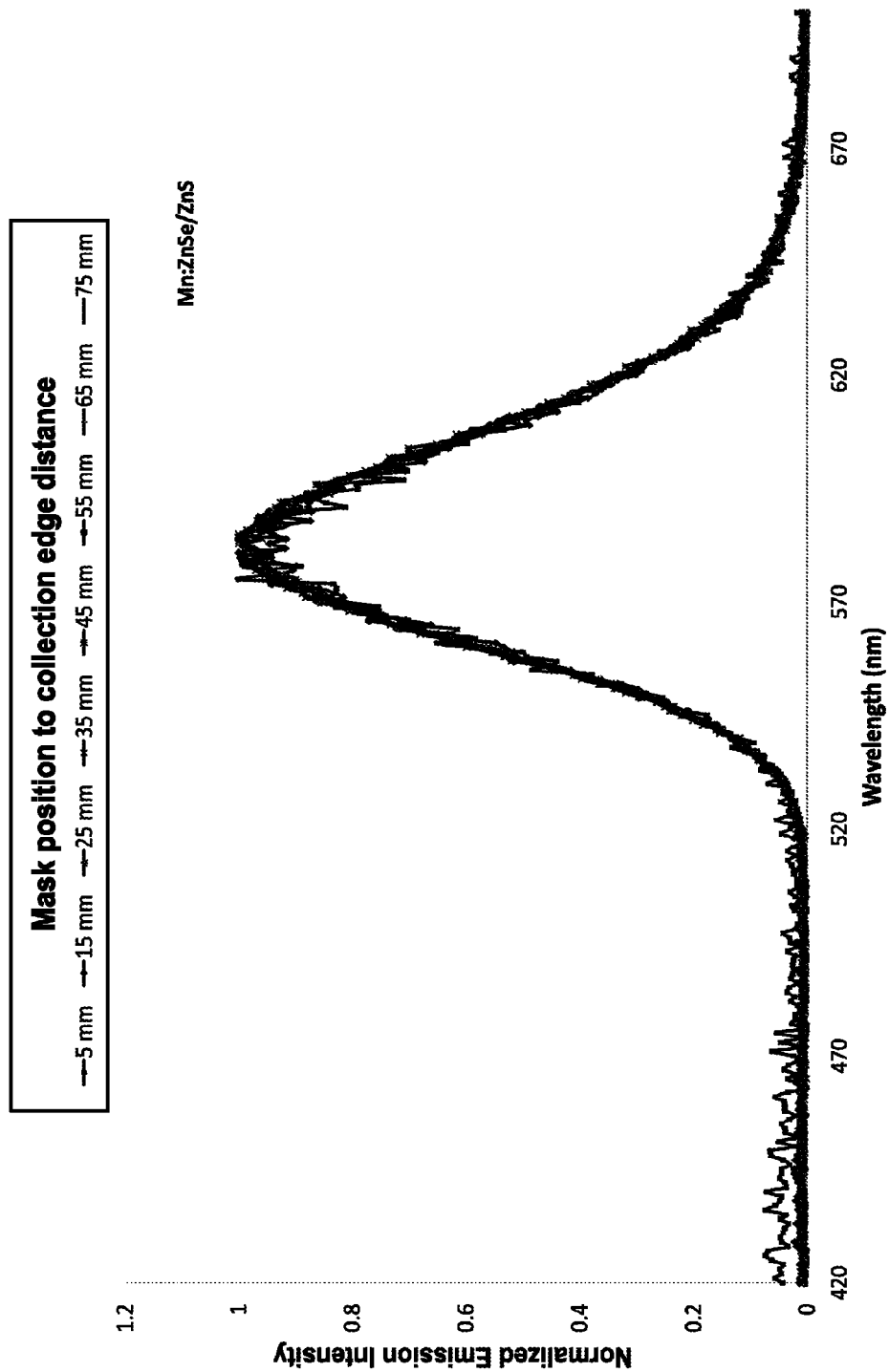
FIGS. 14A-14C are emission spectra collected through the edge aperture as a function of geometric gain for polymer LSCs including embodiments of photoluminescent nanoparticles. Emission spectra were collected using the experimental arrangement illustrated in FIG. 11. Each line represents a different position of the mask, ranging from 5 to 75 mm as measured from the left-hand side of the mask to the collection edge. The corresponding geometric gain ranged from 7.8 to 20.
Figure 14B:
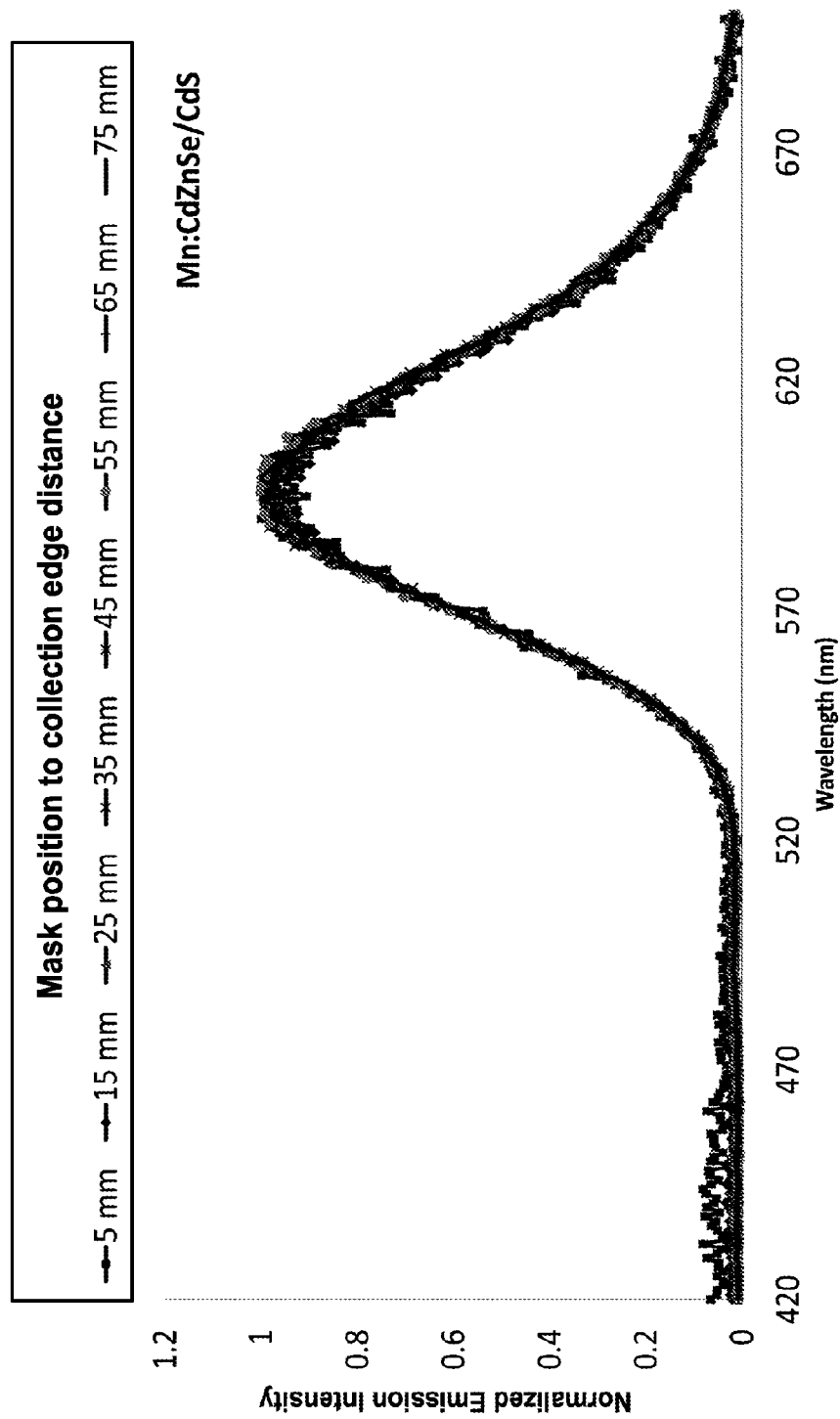
Figure 14C:
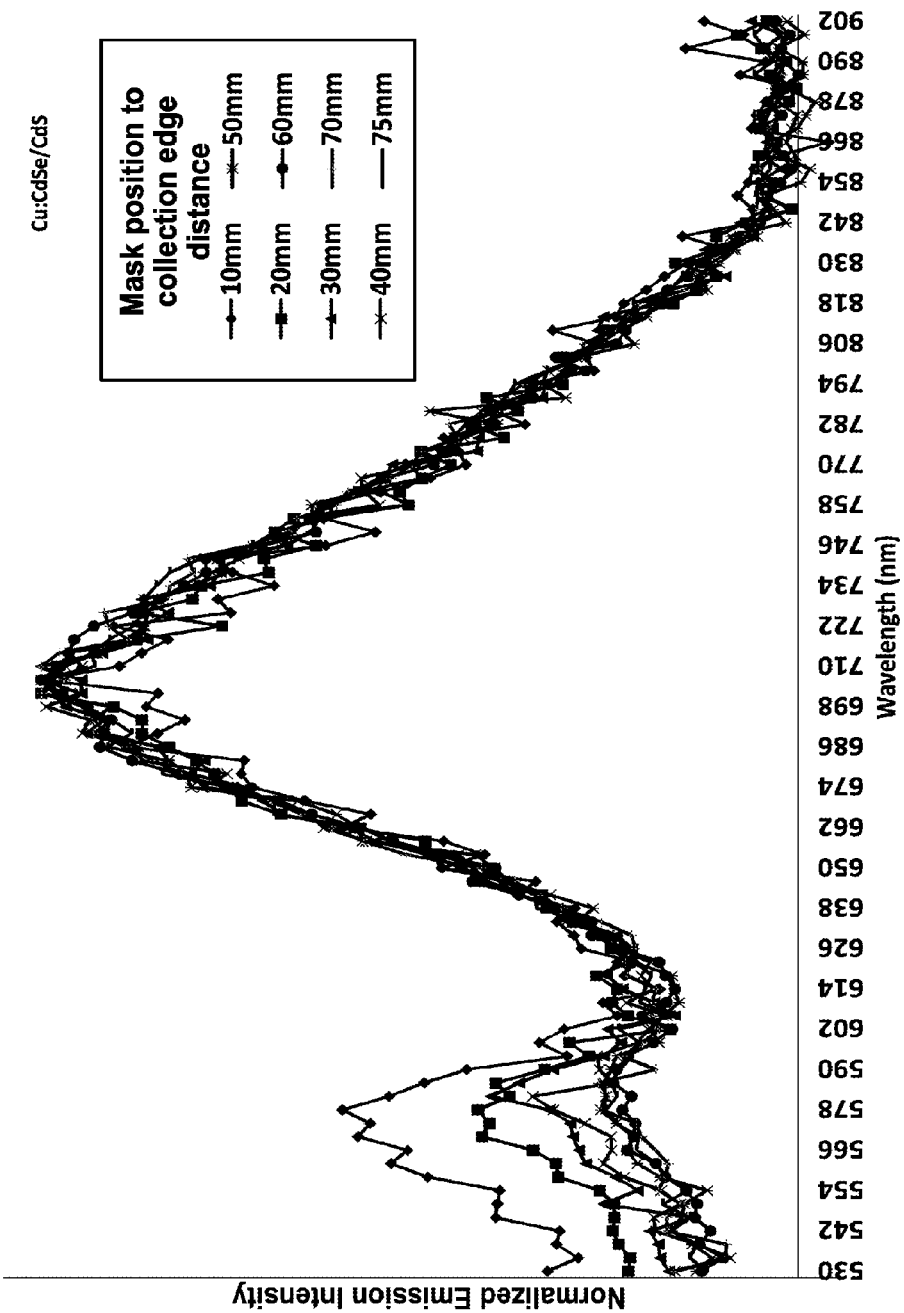

FIGS. 14A-14C show emission spectra collected through the edge aperture as a function of geometric gain for these LSCs. The spectra have been normalized to exhibit a peak value of 1, enabling comparison of the peak position and shape. It is seen that for LSCs incorporating Mn:CdZnSe/ZnS (FIG. 14A) and Mn:ZnSe/ZnS (FIG. 14B) neither the peak position nor shape change with increasing geometric gain. The spectra were nearly indistinguishable, i.e., unchanged as a function of distance. This behavior was in marked contrast to that normally observed in an LSC where self-absorption leads to a progressive red-shifting of edge-emitted light as a function of excitation distance from the edge. The normalized emission spectra for an LSC incorporating Cu:CdSe/CdS photoluminescent nanoparticles shown in FIG. 14C displayed two emission features: an emission feature centered at approximately 580 nm was due to band edge emission, and a second broader and more intense emission feature centered at approximately 700 nm was due to emission from the Cu dopant. Because the band edge feature partially overlaps with Cu:CdSe/CdS absorption the emission becomes progressively more attenuated with increasing geometric gain. The majority of emitted photons, however, were associated with emission from the dopant. These underwent essentially no self-absorption as evidenced by a lack of any significant change in the emission band shape or position with increasing geometric gain.

Liquid Filled LSCs

Liquid-filled LSCs were constructed from two rectangular glass coverslips separated by a spacer and filled with solutions of photoluminescent nanoparticles dispersed in toluene. Cells were rectangular in shape, measuring 2.5 cm×7.5 cm×0.065 cm and the thickness of the photoluminescent nanoparticle-containing liquid layer was 0.033 cm. After filling, cells were sealed around their perimeters using optical adhesive and the full perimeter except for the segment used to measure edge emission was blackened.

Edge emission was measured by illuminating LSCs with a point excitation source positioned a distance d from the collection edge. Light leaving the collection edge was captured in an integrating sphere and passed through a monochrometer before being detected by a photomultiplier tube. OQE was computed as $$OQE = \frac{agN_{em}}{N_{abs}},$$

where $N_{em}$ is the number of photons collected from the edge aperture, $$N_{abs} = \frac{P\lambda}{hc(1-10^{-A})}$$

is the number of photons absorbed by the sample (P and λ are the power and wavelength of the excitation source, A is the LSC absorbance at the excitation wavelength measured by ultraviolet-visible spectroscopy, h is Planck's constant and c is the speed of light). The constant a is the inverse of the fraction of photons reaching the perimeter that arrive traveling within the edge escape cone. Its value was computed via ballistic Monte Carlo simulations employing a modified version of the model of McDowall S. et al., *Appl. Opt.* 2013, 52, 1230-1239, herein incorporated by reference in its entirety, yielding a=1/0.43=2.33. The constant $g^g$ corrected for the collection of light from a small segment $l^l$ of the perimeter. It was computed using the approximation $$g = \frac{2\sqrt{\pi A}}{l} =$$

to account for point illumination. Devices were fabricated using two types of photoluminescent nanoparticles: (a) Mn-doped core-shell ZnSe/ZnS and (b) alloyed $Zn_{1-x-y}Cd_xMn_ySe$.

TABLE 2

| LSC based on | Device configuration | OQE |
|---|---|---|
| Mn: ZnSe/ZnS | Liquid filled | 51% |
| $Zn_{1-x-y}Cd_xMn_ySe$ | Liquid filled | 22% |

Figure 15A:
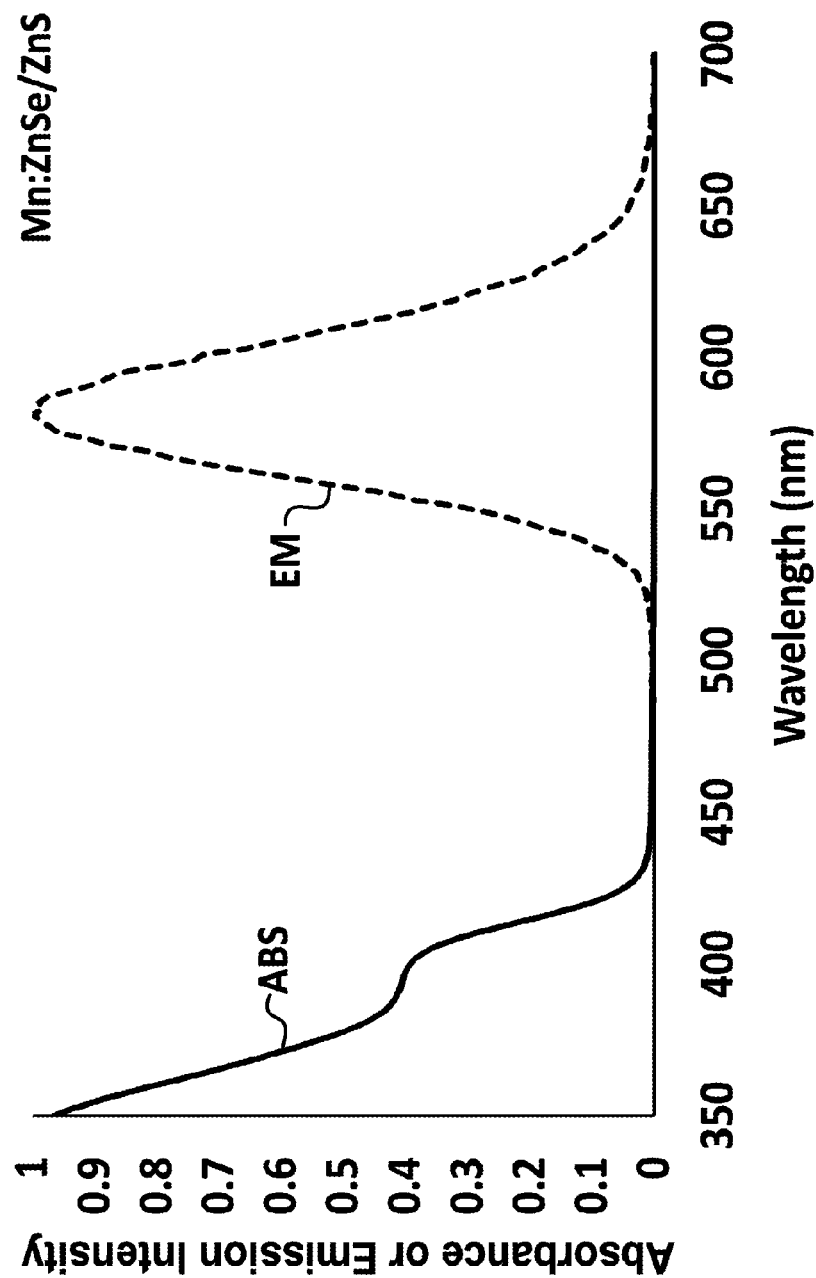
FIGS. 15A and 15B are normalized absorbance (ABS) and emission (EM) spectra of liquid-filled LSCs including embodiments of photoluminescent nanoparticles.
Figure 15B:
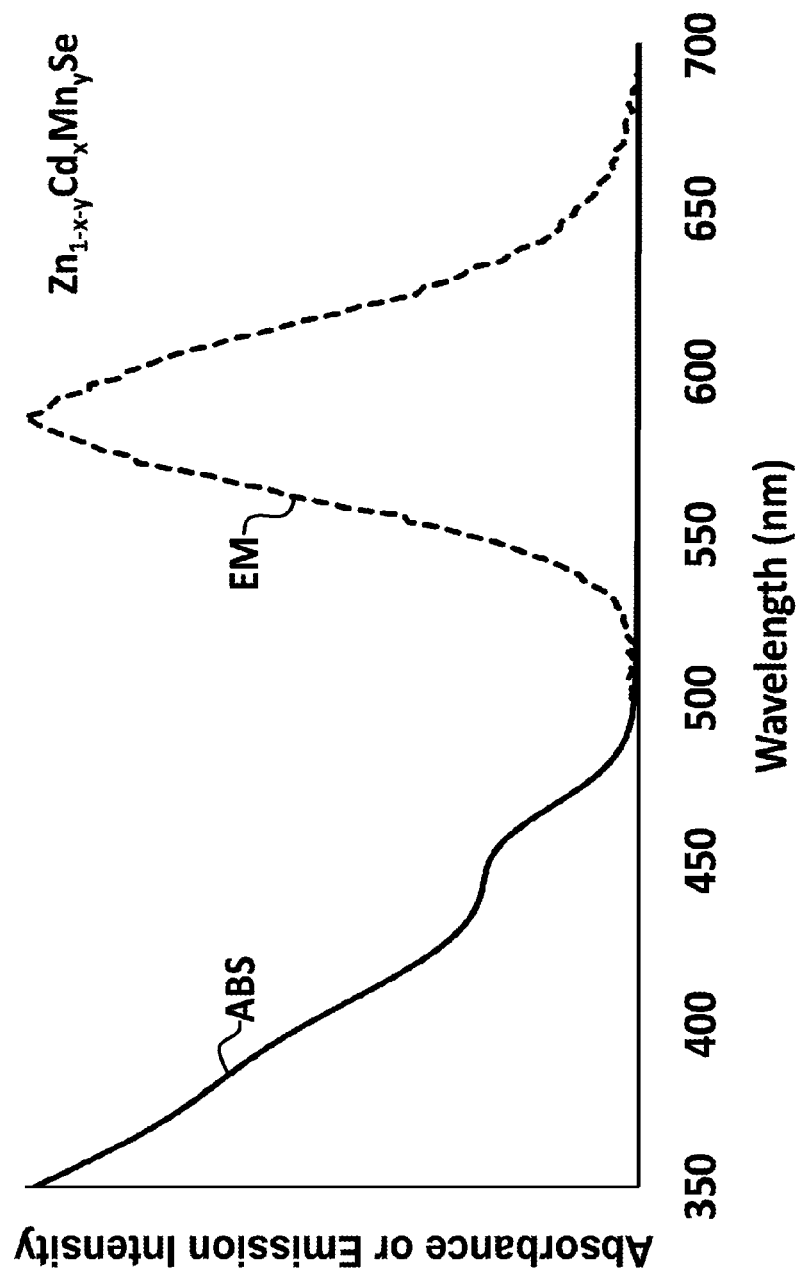

Representative absorption and emission spectra from two devices are shown in FIGS. 15A (Mn:ZnSc/ZnS) and 15B ($Zn_{1-x-y}Cd_xMn_ySc$). As in the case of polymer-based devices, absorption was dominated by the semiconductor nanocrystal sensitizer and emission is dominated by the Mn activator. Average optical quantum efficiencies for the two devices were listed in Table 2.

Figure 16A:
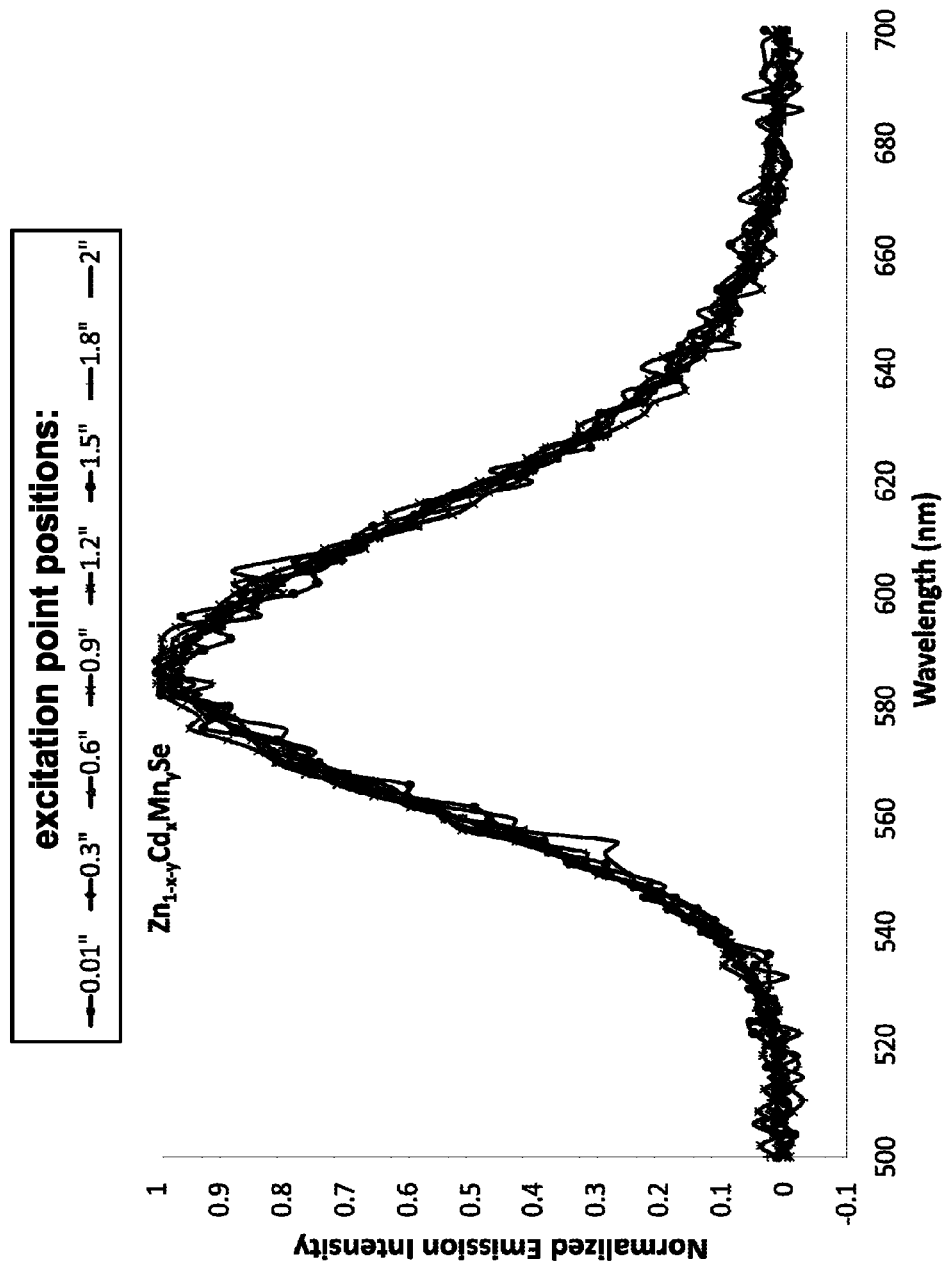
Figure 16B:
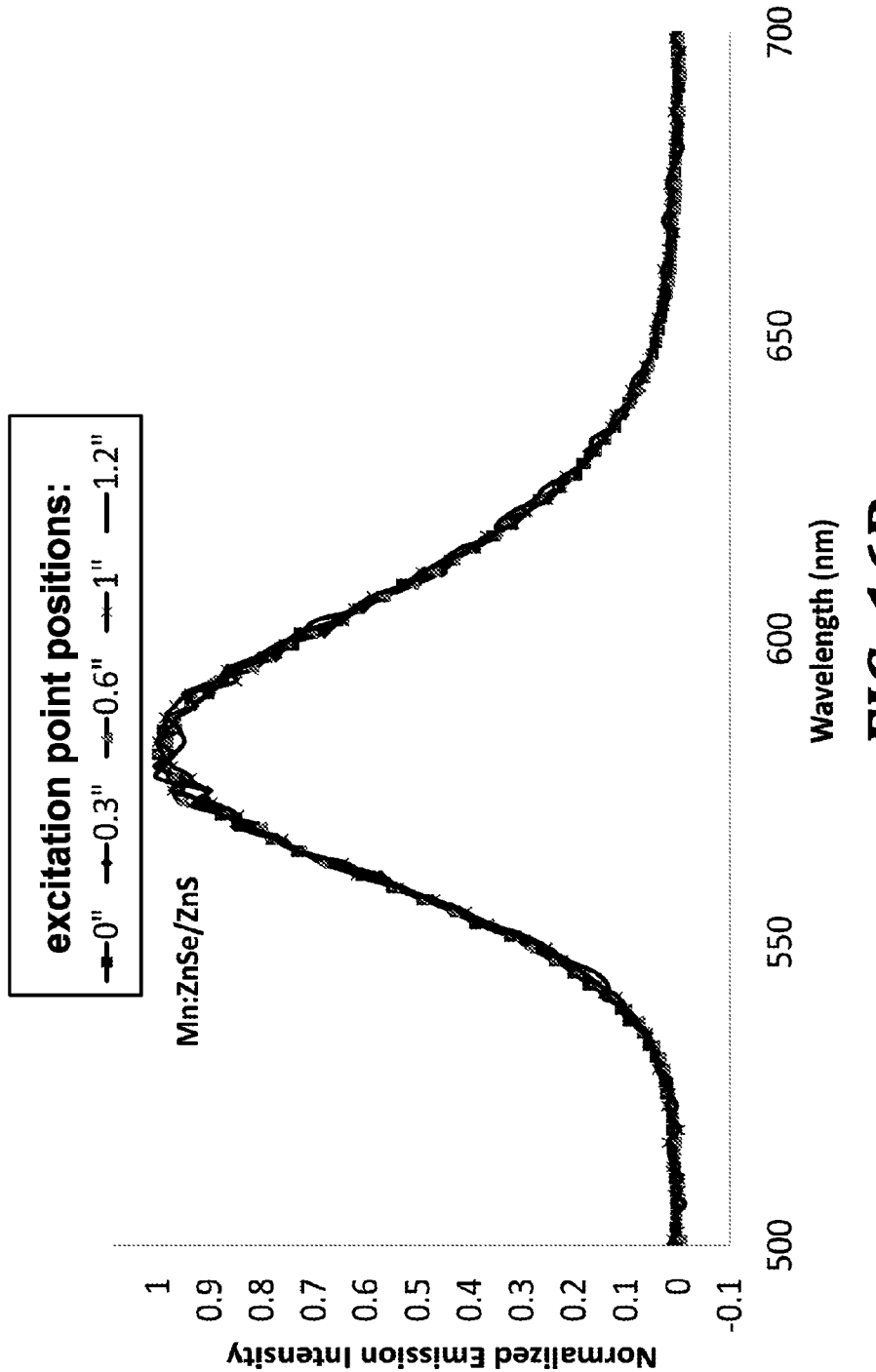

To illustrate the effects of the near total lack of self-absorption by the luminophore, FIGS. 16A ($Zn_{1-x-y}Cd_xMn_ySe$) and 16B (Mn:ZnSe/ZnS) show normalized emission spectra collected from the device edge for five different excitation distances ranging from about 5 mm to about 45 mm from the point of collection in steps of about 8 mm. For each device, the spectra were nearly indistinguishable, i.e., unchanged as a function of distance. As noted above, this behavior was in marked contrast to that normally observed in an LSC where self-absorption lead to a progressive red-shifting of edge-emitted light as a function of excitation distance from the edge.

Figure 17:
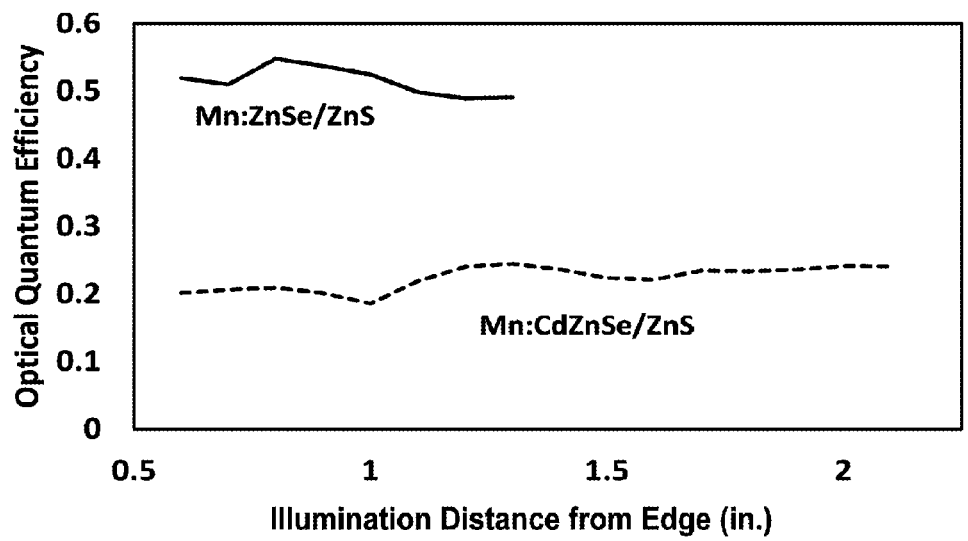
FIG. 17 is a graph showing normalized OQE as a function of excitation distance from the device edge for two photoluminescent nanoparticle-based LSCs.

Further illustrating the performance benefits of photoluminescent nanoparticle-based LSCs, FIG. 17 shows the OQE for the same two devices, determined as a function of excitation distance. The efficiency remained essentially unchanged with distance, again in marked contrast to the behavior observed in LSCs based on other luminophore types where the OQE decreased approximately exponentially with excitation distance from the edge. This indicated that very large area devices could be made without significant degradation of performance.

Example 2: Comparison of Photoluminescent Nanoparticles of the Present Disclosure with Known Photoluminescent Nanoparticles This Example evaluates whether the photoluminescent nanoparticles of the present disclosure can reduce losses from self-absorption and scattering compared to other LSC luminophores, including other types of photoluminescent nanoparticles.

Figure 18:
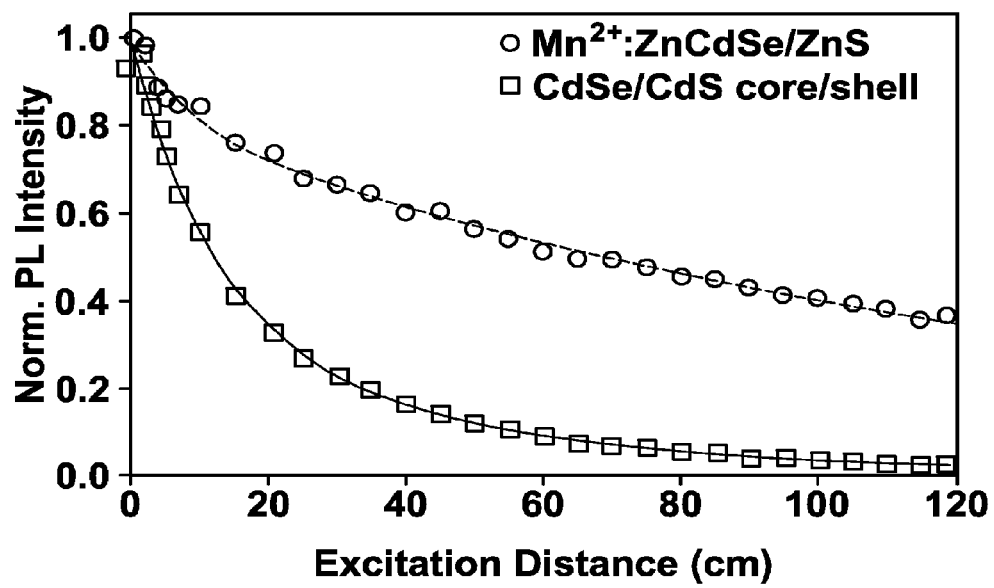
FIG. 18 is a graph comparing normalized waveguided photoluminescence intensities as a function of the distance between excitation and collection for an embodiment of photoluminescent nanoparticles of the present disclosure and an embodiment of photoluminescent nanoparticle of prior art. The data show considerably smaller waveguide losses for the embodiment of photoluminescent nanoparticles of the present disclosure.

Referring to FIG. 18, the normalized waveguided photoluminescence intensities measured in a linear, rod-shaped LSC as a function of the distance between excitation and collection positions for two LSCs incorporating different types of photoluminescent nanoparticles were evaluated. The first LSC included Mn:$Zn_{1-x}Cd_xSe$/ZnS (where x is approximately 0.1) photoluminescent nanoparticles, synthesized as described in Example 1. The second LSC included CdSe/CdS nanoparticles, which are examples of a "giant" shell core-shell semiconductor nanocrystal, a type of photoluminescent nanoparticle known to possess small self-absorption, prepared as described in Chen, O. et al., *Nat. Mater.* 2013, 12, 445-451. Both nanoparticle waveguides have an optical density of 1 over a 1 mm path length at the nanocrystal bandgap energy. The data show considerably smaller waveguide losses for the disclosed photoluminescent nanoparticles.

While illustrative embodiments have been illustrated and described, it will be appreciated that various changes can be made therein without departing from the spirit and scope of the invention.

The invention claimed is:

1. A luminescent solar concentrator, comprising:
   (a) a plurality of photoluminescent nanoparticles, each comprising:
      (i) a semiconductor nanocrystal; and
      (ii) a nanocrystal defect, wherein the nanocrystal defect and the semiconductor nanocrystal combine to produce a photoluminescence effect and wherein the defect is selected from the group consisting of an atom, a cluster of atoms, a lattice vacancy, and any combination thereof; and
   (b) a waveguide material having the plurality of photoluminescent nanoparticles suspended therein or applied to a surface of the waveguide material,
   wherein when exposed to sunlight, the semiconductor nanocrystal of the photoluminescent nanoparticles absorbs energy in the form of light having a first wavelength, the absorbed energy is transferred to the nanocrystal defect, the nanocrystal defect then spontaneously emits light having a second wavelength longer than the first wavelength into the waveguide material, the light having the second wavelength is captured by total internal reflection in the waveguide material, and the light having the second wavelength then travels through the waveguide material and is emitted by the waveguide material or optically communicated to a light-utilization device.

2. The luminescent solar concentrator of claim 1, wherein the nanocrystal defect is located within or on a surface of the semiconductor nanocrystal.

3. The luminescent solar concentrator of claim 1, wherein the photoluminescent nanoparticle comprises a material selected from the group consisting of CdSe, CdS, CdTe, ZnSe, ZnS, ZnTe, InN, InP, AlGaAs, InGaAs, CuS, $Ag_2S$, $CuInSe_2$, $CuInS_2$, $In_2S_3$, GaP, InP, GaN, AN, GaAs, PbS, PbSe, PbTe, CuCl, $Cu_2S$, $Cu_2Se$, $Cu_2ZnSnS_4$, $Cu_2ZnSnSe_4$, $Cu_2ZnSnTe_4$, $CuInTe_2$, Si, Ge, $Y_2O_3$, $Y_2S_3$, $Y_2Se_3$, $NaYF_4$, $NaYS_2$, $LaF_3$, $YF_3$, ZnO, $TiO_2$, $La_2O_2S$, $Y_2O_2S$, $Gd_2O_2S$, $Zn_3N_2$, $Zn_3P_2$, alloys thereof, heterostructures thereof, and any combination thereof.

4. The luminescent solar concentrator of claim 1, wherein each photoluminescent nanoparticle further comprises a passivation layer on a surface.

5. The luminescent solar concentrator of claim 4, wherein the passivation layer comprises a passivation material selected from CdSe, CdS, CdTe, ZnSe, ZnS, ZnTe, InN, InP, AlGaAs, InGaAs, CuS, $Ag_2S$, $CuInSe_2$, $CuInS_2$, $In_2S_3$, GaP, InP, GaN, AN, GaAs, PbS, PbSe, PbTe, CuCl, $Cu_2S$, $Cu_2Se$, $Cu_2ZnSnS_4$, $Cu_2ZnSnSe_4$, $Cu_2ZnSnTe_4$, $CuInTe_2$, Si, Ge, $Y_2O_3$, $Y_2S_3$, $Y_2Se_3$, $NaYF_4$, $NaYS_2$, $LaF_3$, $YF_3$, ZnO, $TiO_2$, $La_2O_2S$, $Y_2O_2S$, $Gd_2O_2S$, $Zn_3N_2$, $Zn_3P_2$, alloys thereof, and any combination thereof.

6. The luminescent solar concentrator of claim 1, wherein each photoluminescent nanoparticle further comprises a capping molecule on a surface.

7. The luminescent solar concentrator of claim 6, wherein the capping molecule is selected from the group consisting of an amine, a carboxylate, a phosphonate, a phosphine, a phosphine oxide, an oligomeric phosphine, a thiol, a dithiol, a disulfide, an N-containing heterocycle, and any combination thereof.

8. The luminescent solar concentrator of claim 6, wherein the capping molecule is selected from the group consisting of dodecylamine, trioctylamine, oleylamine, trioctylphosphonate, trioctylphosphine oxide, trioctylphosphine, pyridine, acetate, stearate, myristate, and oleate.

9. The luminescent solar concentrator of claim 6, wherein the capping molecules comprise a reactive functional group selected from the group consisting of olefin, silane, acrylate, or epoxide, and any combination thereof.

10. The luminescent solar concentrator of claim 1, wherein each photoluminescent nanoparticle further comprises an inorganic molecule selected from the group consisting of $BF_4^-$, $S^{2-}$, $HS^-$, $Se^{2-}$, $HSe^-$, $Te^{2-}$, $HTe^-$, $TeS_3^{2-}$, $OH^-$, and $NH_2^-$, $In_2Se_4^{2-}$, $SnTe_4^{4-}$, $AsS_3^{3-}$, $Sn_2S_6^{4-}$, $SCN^-$, and related inorganic molecules thereof, on a surface of the photoluminescent nanoparticle.

11. The luminescent solar concentrator of claim 1, wherein each photoluminescent nanoparticle further comprises an polymeric molecule that comprises a side chain comprising a moiety selected from the group consisting of phosphines, phosphine oxides, phosphonates, phosphine oxides, pyridines, amines, amides, carboxylic acids, carboxylates, thiols, and any combination thereof, on a surface of the photoluminescent nanoparticle.

12. The luminescent solar concentrator of claim 1, wherein each photoluminescent nanoparticle comprises a core-shell structure.

13. The luminescent solar concentrator of claim 1, wherein the atom or cluster of atoms is selected from the group consisting of Mn, Co, Cu, Pt, Ru, V, Cr, Ag, Au, Al, Bi, Sb, Cl, Br, or I, Ce, Pr, Nd, Sm, Eu, Tb, Dy, Ho, Er, Tm, and Yb.

14. The luminescent solar concentrator of claim 1, wherein the atom or cluster of atoms comprises Mn.

15. The luminescent solar concentrator of claim 1, wherein the lattice vacancy is an atomic vacancy.

16. The luminescent solar concentrator of claim 1, wherein the defect is present at a mole fraction of 10% or less.

17. The luminescent solar concentrator of claim 1, wherein the defect is present in a mole fraction of about 1%.

18. The luminescent solar concentrator of claim 1, wherein the defect is one of an atom, a cluster of atoms, or a lattice vacancy.

19. The luminescent solar concentrator of claim 1, wherein the defect is two or more of an atom, a cluster of atoms, and a lattice vacancy.

20. The luminescent solar concentrator of claim 1, wherein each photoluminescent nanoparticle further comprises a wide-gap nanocrystal selected from the group consisting of $NaYF_4$, $Gd_2O_2S$, $NaYS_2$, $Y_2S_3$, and $CePO_4$.

21. The luminescent solar concentrator of claim 20, wherein the wide-gap nanocrystal comprises a dopant.

22. The luminescent solar concentrator of claim 21, wherein the dopant comprises Yb.

23. The luminescent solar concentrator of claim 1, wherein the photoluminescent nanoparticles are selected from the group consisting of Mn-doped ZnSe/ZnS/CdS/ZnS, Cu-doped InP/ZnS, $Zn_{1-x-y}Cd_xMn_ySe$/ZnS, Yb-doped $Si/SiO_2$, Yb-doped $NaYF_4$/CdSe/ZnSe, $Cu_xZn_yIn_zSe_{2-\delta}$, and Yb-doped CdTe/ZnS.

24. The luminescent solar concentrator of claim 1, wherein the photoluminescent nanoparticles have an average maximum dimension of 10 nm or less.

25. The luminescent solar concentrator of claim 1, wherein the photoluminescent nanoparticles have an optical transmittance of 90% or more below the nanoparticle bandgap energy.

26. The luminescent solar concentrator of claim 1, wherein the photoluminescent nanoparticles have an optical transmittance of 10% or less above the nanoparticle bandgap energy.

27. The luminescent solar concentrator of claim 1, wherein an absorption coefficient of the photoluminescent nanoparticles at an energy equal to the nanoparticle bandgap energy exceeds an absorption coefficient at an energy equal to the maximal emission by a factor of at least 500.

28. The luminescent solar concentrator of claim 1, wherein the photoluminescent nanoparticles have an absorption spectrum and an emission spectrum, and the emission spectrum and lowest absorption band do not overlap by greater than 25% in their integrated normalized areas.

29. The luminescent solar concentrator of claim 1, wherein the waveguide material is selected from the group consisting of a polyacrylate, a polycarbonate, an inorganic glass, a polycrystalline solid, an amorphous solid, a cyclic perfluorinated polyether, a polysilicone, a polysiloxane, a polyalkylacrylate, a cyclic olefin.

30. The luminescent solar concentrator of claim 1, wherein the waveguide material is poly(methyl methacrylate), poly(lauryl methacrylate), or cross-linked derivatives thereof.

31. The luminescent solar concentrator of claim 1, wherein the waveguide material has a surface roughness of 2 nm or less.

32. The luminescent solar concentrator of claim 1, comprising a photoluminescent nanoparticle to waveguide material weight ratio of less than 10%.

33. The luminescent solar concentrator of claim 1, wherein the luminescent solar concentrator has an optical quantum efficiency of up to about 75% at geometric gains exceeding 20.

34. The luminescent solar concentrator of claim 1, having an attenuation coefficient of less than 0.05 dB/cm at a wavelength corresponding to a peak emission of the plurality of photoluminescent nanoparticles.

35. The luminescent solar concentrator of claim 1, further comprising at least one cladding layer in optical communication with the waveguide material, wherein the cladding layer has a refractive index less than a refractive index of the waveguide.

36. The luminescent solar concentrator of claim 1, further comprising a light-utilization device in optical communication with the waveguide material, wherein the light-utilization device is selected from the group consisting of a photovoltaic cell, a solar heater, a concentrated solar thermal power system, a lighting device, and a photochemical reactor.

37. A window pane comprising the luminescent solar concentrator of claim 1.

38. A coating comprising the luminescent solar concentrator of claim 1.

39. A free-standing polymer film comprising the luminescent solar concentrator of claim 1.

40. An electronic display comprising the luminescent solar concentrator of claim 1.

41. A touch screen comprising the luminescent solar concentrator of claim 1.

42. The luminescent solar concentrator of claim 1, wherein waveguide material is planar.

43. The luminescent solar concentrator of claim 1, wherein the waveguide has two major surfaces and one or more minor surfaces.

44. The luminescent solar concentrator of claim 1, wherein the photoluminescent particles comprise $CuInS_2$, $CuInSe_2$, alloys thereof, or heterostructures thereof; and have a defect selected from an aliovalent Cu atom, a lattice vacancy, and a combination thereof.

* * * * *

UNITED STATES PATENT AND TRADEMARK OFFICE
CERTIFICATE OF CORRECTION

Page 1 of 1

PATENT NO. : 9,964,680 B2
APPLICATION NO. : 14/902113
DATED : May 8, 2018
INVENTOR(S) : Patrick et al.

It is certified that error appears in the above-identified patent and that said Letters Patent is hereby corrected as shown below:

In the Claims

| Column | Line | Error |
|---|---|---|
| 26 (Claim 3, Line 5) | 65 | "AN," should read --AlN,-- |
| 27 (Claim 5, Line 5) | 11 | "AN," should read --AlN,-- |
| 27 (Claim 11, Line 3) | 45 | "an polymeric" should read --a polymeric-- |

Signed and Sealed this
Ninth Day of July, 2019

Andrei Iancu
*Director of the United States Patent and Trademark Office*